United States Patent
Tomotani et al.

(10) Patent No.: US 8,625,328 B2
(45) Date of Patent: Jan. 7, 2014

(54) VARIABLE RESISTANCE NONVOLATILE STORAGE DEVICE

(75) Inventors: Hiroshi Tomotani, Osaka (JP); Kazuhiko Shimakawa, Osaka (JP); Ken Kawai, Osaka (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 13/126,257

(22) PCT Filed: Aug. 26, 2010

(86) PCT No.: PCT/JP2010/005254
§ 371 (c)(1),
(2), (4) Date: Apr. 27, 2011

(87) PCT Pub. No.: WO2011/045886
PCT Pub. Date: Apr. 21, 2011

(65) Prior Publication Data
US 2011/0216577 A1    Sep. 8, 2011

(30) Foreign Application Priority Data
Oct. 15, 2009 (JP) ................. 2009-238766

(51) Int. Cl.
*G11C 11/00* (2006.01)
(52) U.S. Cl.
USPC ........... 365/148; 365/158; 365/163; 365/171; 365/173
(58) Field of Classification Search
USPC ................ 365/148, 158, 163, 171, 173
See application file for complete search history.

(56) References Cited

U.S. PATENT DOCUMENTS

| | | | |
|---|---|---|---|
| 7,408,212 B1 * | 8/2008 | Luan et al. | 257/295 |
| 2004/0114429 A1 * | 6/2004 | Ehiro et al. | 365/158 |
| 2005/0117397 A1 * | 6/2005 | Morimoto | 365/185.21 |
| 2005/0174840 A1 | 8/2005 | Tsushima et al. | |
| 2005/0281073 A1 | 12/2005 | Cho et al. | |
| 2006/0067106 A1 | 3/2006 | Mori et al. | |

(Continued)

FOREIGN PATENT DOCUMENTS

| | | |
|---|---|---|
| JP | 2005-235360 | 9/2005 |
| JP | 2006-004614 | 1/2006 |

(Continued)

OTHER PUBLICATIONS

International Search Report issued Nov. 22, 2010 in International (PCT) Application No. PCT/JP2010/005254.

*Primary Examiner* — Thao Bui
(74) *Attorney, Agent, or Firm* — Wenderoth, Lind & Ponack, L.L.P.

(57) ABSTRACT

The variable resistance nonvolatile storage device reduces variations in a resistance value of a variable resistance element (100) in the low resistance state, performs stable operations, and includes an LR write circuit (500) (i) applying a voltage to a memory cell (102) so that a resistance state of the variable resistance element included in the memory cell is changed from high to low, and (ii) including a first driving circuit (510) and a second driving circuit (520) which apply voltages to the memory cell and which have connected output terminals. When applying a voltage to the memory cell, the first driving circuit supplies a first current, and the second driving circuit (i) supplies a second current when a voltage at the output terminal of the first driving circuit is higher than a reference voltage VREF, and (ii) is in a high impedance state when the voltage is lower than the VREF.

21 Claims, 22 Drawing Sheets

(56) References Cited

U.S. PATENT DOCUMENTS

2007/0242528 A1* 10/2007 Inoue ................ 365/189.01
2009/0262568 A1  10/2009 Ono et al.
2010/0091551 A1*  4/2010 Hosono et al. ............ 365/148
2010/0110767 A1   5/2010 Katoh et al.
2010/0118591 A1   5/2010 Sugibayashi

FOREIGN PATENT DOCUMENTS

| JP | 4148210 | 9/2008 |
|---|---|---|
| JP | 2009-026382 | 2/2009 |
| WO | 2008/012871 | 1/2008 |
| WO | 2008/120480 | 10/2008 |
| WO | 2008/129774 | 10/2008 |

* cited by examiner

VARIABLE RESISTANCE NONVOLATILE STORAGE DEVICE

TECHNICAL FIELD

The present invention relates to a variable resistance nonvolatile storage device including memory cells each including a selection element and a variable resistance element whose resistance value reversibly changes based on an electrical signal.

BACKGROUND ART

In recent years, the research and development on nonvolatile storage devices including memory cells using variable resistance elements has been conducted. The variable resistance element is an element having characteristics in which a resistance value reversibly changes based on an electrical signal, and capable of storing data corresponding to the resistance value with nonvolatility.

What is generally known as a nonvolatile storage device using such variable resistance elements is a nonvolatile storage device including 1T1R memory cells arranged in a matrix. Each of the memory cells includes a MOS transistor and a variable resistance element that are connected in series, at an intersection point between (i) a bit line and (ii) a word line and a source line, where the lines cross at right angles.

Furthermore, in order to further develop integrated circuits, there has been an increase in the research on cross-point nonvolatile storage devices each including diode elements and variable resistance elements that are connected in series, at intersection points between bit lines and word lines that cross at right angles.

PTL 1 discloses memory cells each including (i) a variable resistance element that stores and holds information according to an electric resistance state and (ii) a circuit element connected in series with the variable resistance element. With application of a voltage and a current to the memory cell, the variable resistance element can have a resistance value that reversibly changes between a low resistance state and a high resistance state.

FIG. 19 illustrates a circuit diagram of a memory cell C used in a storage device disclosed in PTL 1. The memory cell C includes a variable resistance element A and a circuit element T which are electrically connected in series with each other. The variable resistance element A has a structure including a storage layer between two electrodes (for example, upper electrode and lower electrode), and the storage layer includes an amorphous thin film, such as a rare-earth metal oxide film. PTL 1 discloses that the rare-earth metal oxide film comprises metals that can be easily ionized, such as Cu, Ag, and Zn. Furthermore, the circuit element T includes a Metal-Insulator-Semiconductor (MIS) transistor. The MIS transistor serves as an active element that controls access to the variable resistance element A, with application of a predetermined voltage $V_{GS}$ to a gate terminal of the transistor. It also serves as a load device for the variable resistance element A. When the circuit element is in an ON state, the resistance value of the variable resistance element A can be changed with application of a predetermined voltage and a current to end terminals V1 and V2 of the memory cell C.

FIG. 20 illustrates changes in voltage and current of the variable resistance element A disclosed in PTL 1. Assuming that the operation of changing resistance of the variable resistance element A from a high resistance state to a low resistance state is a writing operation and the operation of changing resistance of the variable resistance element A from the low resistance state to the high resistance state is an erasing operation, the variable resistance element A initially has a large resistance value and is in a state where current is hard to flow (ST1). Then, with application of a write threshold voltage or higher (+1.1×[V]), the current flows and the resistance value is being decreased (ST2). Then, the variable resistance element A exhibits Ohmic characteristics (ST3), and the current flows in proportion to the voltage. Afterward, even when the voltage becomes 0 V, the variable resistance element A continues to hold the low resistance value. Next, when a negative voltage is being applied to the variable resistance element A and the application voltage is being increased, the current decreases with application of an erase threshold voltage (−1.1×[V]) (ST4). Then, the resistance of the variable resistance element A is changed to resistance as same as that in the erase state. Afterward, even when the voltage becomes 0 V, the variable resistance element A continues to hold the high resistance value (ST5).

FIG. 21 illustrates changes in an operating point of the variable resistance element A disclosed in PTL 1. The vertical axis represents the current [A] that flows through an MIS transistor T corresponding to the circuit element T and the variable resistance element A, and the horizontal axis represents the voltage [V] that is applied to the MIS transistor T and the variable resistance element A. In the graph, dashed lines represent the voltage/current characteristics when the gate voltage of the MIS transistor T is changed to VG1, VG2, and VG3 (VG1>VG2>VG3), while solid lines represent the voltage/current characteristics of the variable resistance element A in the low and high resistance states. The high resistance state is represented to overlap the horizontal axis.

As indicated by the solid lines in FIG. 21, the resistance state of the variable resistance element A is changed from the high resistance state to the low resistance state, with application of the voltage Vth (approximately 0.52 V) between the electrodes of the variable resistance element A by applying the voltage V (1.0 V) between the end terminals V1 and V2 of the memory cell C. Here, the graph indicates that the resistance value of the variable resistance element A is determined according to a value of the current that flows through the variable resistance element A through the MIS transistor T. For example, when the gate voltage is VG1, the current flows up to an operating point P1 indicating the highest current. The resistance value calculated based on the relationship between the voltage and the current at the operating point P1 is a resistance value of the variable resistance element A in the low resistance state. Similarly, when the gate voltage is VG2, the current flows up to an operating point P2 where the resistance state is high. When the gate voltage is VG3, the current flows up to an operating point P3 where the resistance state is much higher. Thus, the graph indicates that the resistance values calculated based on the relationship between the voltage and the current at the respective operating points P2 and P3 are resistance values of the variable resistance element A in the low resistance state.

In other words, controlling (i) the voltage to be applied to the end terminals of the memory cell C including the variable resistance element A and the MIS transistor T and (ii) the gate voltage of the MIS transistor T enables controlling of the resistance value of the variable resistance element A in the low resistance state. PTL 1 discloses the storage device capable of recording multi-valued data using this feature.

Next, PTL 2 discloses a storage device that achieves stable operations with application of a uniform voltage to each memory cell in a memory cell array. Between the voltage application circuit that applies a write voltage to the memory cells and the memory cells, long metal lines such as bit lines exist. When the memory cell closer to the voltage application circuit is accessed in the case of performing the writing operation for the low resistance state, the voltage drop caused by the line resistance is small. Thus, a large amount of current can flow, and the resistance state of the memory cell is changed to the low resistance state having a lower resistance value. On the other hand, when the memory cell distant from the voltage application circuit is accessed, the voltage drop caused by the line resistance is large. Thus, the amount of current that flows decreases, and the resistance state of the memory cell is changed to the low resistance state having a resistance value higher than that of the former case.

In other words, PTL 2 suggests the technique to solve the problems that a resistance value in the low resistance state to be written in the memory cell depends on a place where the memory cell is arranged and the uniform operation cannot be performed.

FIG. 22 illustrates, as a solution disclosed in PTL 2, a structure including (i) drivers each of which applies a predetermined voltage to a bit line connected to a terminal of another bit line, and (ii) operational amplifiers each of which adjusts the voltage applied by the driver to the bit line by comparing, with a preset voltage, the voltage to be applied to a memory element positioned to the other end of the bit line.

CITATION LIST

Patent Literature

[PTL 1] Japanese Unexamined Patent Application Publication No. 2005-235360
[PTL 2] Japanese Patent No. 4148210

SUMMARY OF INVENTION

Technical Problem

The inventors of the present application have considered implementation of stable resistance change operations performed by a variable resistance nonvolatile storage device including 1T1R memory cells each including a variable resistance layer comprising a oxygen-deficient transition metal oxide $TaO_x$ ($0<x<2.5$) comprising tantalum (Ta) that is one of transition metals. Here, the oxygen-deficient transition metal oxide is a transition metal oxide having an oxygen content (atom ratio, that is, proportion of the number of oxygen atoms to the total atoms) lower than that of a transition metal oxide having a stoichiometric composition. Generally, the transition metal oxide having the stoichiometric composition includes an insulator or has a very high resistance value. For example, when the transition metal oxide is Ta, the stoichiometric composition is denoted as $Ta_2O_5$, and the ratio of the number of O atoms to the number of Ta atoms (O/Ta) is 2.5. Thus, in the oxygen-deficient transition metal oxide, the ratio of O atoms to Ta atoms is larger than 0 and smaller than 2.5.

First, several features of a variable resistance element that were obtained from measurements will be described hereinafter. The variable resistance element includes a variable resistance layer comprising an oxygen-deficient Ta oxide.

FIG. 1 schematically illustrates a basic structure of a 1T1R memory cell 102 in which a variable resistance element 100 is connected in series with a selection transistor 101 that is a first switch element. The variable resistance element 100 includes a lower electrode (first electrode) 103 comprising TaN, an upper electrode (second electrode) 105 comprising Pt, and a variable resistance layer 104 comprising $TaO_x$ that is the oxygen-deficient transition metal oxide. The lower electrode 103 of the variable resistance element 100 is connected to one of diffusion layer terminals (for example, drain terminal) of the selection transistor 101, the other diffusion layer terminal (for example, source terminal) is led out as a PD terminal of the memory cell 102, the upper electrode 105 is led out as a PU terminal of the memory cell 102, and the gate terminal of the selection transistor 101 is led out as a PG terminal of the memory cell 102.

The inventors have clarified in their research that under the structure, the variable resistance layer 104 can be set to a high resistance state with application of a positive voltage to the upper electrode 105 with respect to the lower electrode 103, and the variable resistance layer 104 can be set to a low resistance state with application of a positive voltage to the lower electrode 103 with respect to the upper electrode 105.

Thus, respective resistance values can be set as follows. A method of setting a predetermined resistance state to the memory cell 102 is applying a write voltage that enables turning on the selection transistor 101, to the PG terminal of the memory cell 102. A method of setting the high resistance state to the memory cell 102 is applying a high resistance voltage Vph to the PU terminal with respect to the PD terminal of the memory cell 102. A method of setting the low resistance state to the memory cell 102 is applying a low resistance voltage Vpl to the PD terminal with respect to the PU terminal of the memory cell 102.

A method of reading the resistance state of the memory cell 102 is applying a read voltage that enables turning on the selection transistor 101, to the PG terminal of the memory cell 102, then applying a low read voltage Vpr low enough to prevent data from being written, between the PD terminal and the PU terminal of the memory cell 102, and measuring a memory cell current Ir that flows through the memory cell 102. Thereby, the resistance value of the memory cell 102 can be calculated.

FIG. 2 illustrates an example of a result of evaluation on the memory cell read current Ir that has been read after changing the resistance state of the memory cell 102. More specifically, FIG. 2 illustrates a result of applying, to a representative memory cell of 1 bit, a pulse for the high resistance state and a pulse for the low resistance state alternately 200 times, and measuring the memory cell current Ir for each application of the pulse. The vertical axis represents the memory cell current Ir [μA] that flows through the memory cell 102, and the horizontal axis represents the number of measurements. The pulses applied for changing the resistance state have a pulse width of 50 ns. The PG terminal is set to 2.4 V, and the voltages to be applied between the PD terminal and the PU terminal are alternately switched between 0 V and 2.4 V. Furthermore, the memory cell current Ir was measured under the same condition with application of 2.4 V to the PG terminal, 0 V to the PU terminal, and 0.4 V to the PD terminal.

Table 1 below is a summary of the result, indicating (i) each average of the memory cell currents Ir with application of the pulse for the high resistance state 200 times, or the pulse for the low resistance state 200 times, and (ii) each difference between the largest value and the smallest value as variations in the memory cell currents Ir.

TABLE 1

|  | Ir (average of 200 times) | ΔIr (largest value − smallest value) |
|---|---|---|
| High resistance state | 0.93 [μA] | 2.0 [μA] |
| Low resistance state | 44.0 [μA] | 9.2 [μA] |

When the memory cell 102 was in the high resistance state, approximately 0.93 [μA] that is the average of the memory cell currents Ir flowed, which indicates that there was almost no current flow. When the memory cell 102 was in the low resistance state, approximately 44.0 [μA] that is the average of the memory cell currents Ir flowed. Thus, the high resistance state and the low resistance state are clearly distinguished from each other. Focusing on ΔIr (largest value−smallest value) of the memory cell current Ir, ΔIr in the high resistance state was 2.0 [μA], while ΔIr in the low resistance state was 9.2 [μA]. Thus, it was found that the difference irregularly varies with a predetermined width, regardless of repeated operations on the same memory cell 102 under the same condition.

Since the memory cell current Ir had the measurement error as small as 0.2 [μA], variations in the memory cell current Ir (ΔIr) are probably not caused by the precision of the measurements.

Furthermore, PTL 1 discloses that the resistance value of a variable resistance element is determined according to a current value of a current supplied by a transistor in the low resistance state. Assuming that the variations are caused by variations in the current supplied by the transistor, it indicates that the characteristics of the selection transistor 101 vary approximately 10% for each resistance change. However, since MOS transistors have been conventionally known as very stable elements, it seems unlikely that characteristics of the transistors vary for each switching operation.

Moreover, PTL 2 discloses that write states vary due to a voltage drop caused by a line resistance component depending on arrangement of memory cells. However, the aforementioned measurements obtained the variations in the same memory cell, and the line resistance was maintained constant. Thus, the variations were caused due to a factor different from that of PTL 2.

As a result of the keen examination, the inventors estimated that the variations in the memory cell current Ir after the resistance change in the same memory cell were not caused by a conventionally known factor, but the variable resistance characteristics of the variable resistance element 100 itself varied within a certain range for each resistance change.

In a memory device using the magnitude of a memory cell current as storage information, the smallest value of the memory cell current limits the reading speed, in particular, when the memory device is in the low resistance state. In addition, a difference between the smallest value of the memory cell current when the memory device is in the low resistance state and the largest value of the memory cell current when the memory device is in the high resistance state substantially affects the operating margin.

Considering operations performed by a memory cell array that is a collection of memory cells, the inventors have found that the reading speed further slows down and the operating margin further decreases, due to variations that have been conventionally known, such as variations caused by a difference in arrangement of memory cells as disclosed by PTL 2 and various variations in the processes, such as a threshold Vt of a selection transistor.

The present invention has been conceived in view of such circumstances, and has an object of providing a variable resistance nonvolatile storage device that includes memory cells each including a variable resistance element and a selection element (switch element), in particular, a variable resistance nonvolatile storage device that reduces variations in resistance value of the variable resistance element in its low resistance state and that performs stable operations.

Solution to Problem

In order to achieve the object, the variable resistance nonvolatile storage device according to an aspect of the present invention is a variable resistance nonvolatile storage device including: a memory cell array including memory cells arranged in a matrix, each of the memory cells including a variable resistance element and a first switch element connected in series with the variable resistance element, the variable resistance element including (i) a first electrode, (ii) a second electrode, and (iii) a nonvolatile variable resistance layer disposed between the first electrode and the second electrode, the nonvolatile variable resistance layer having a resistance state that reversibly changes between a high resistance state and a low resistance state according to a polarity of a voltage to be applied between the first electrode and the second electrode; a selection circuit that selects at least one of the memory cells from the memory cell array; a high-resistance-state write circuit that applies a voltage to the memory cell selected by the selection circuit so as to change a resistance state of the variable resistance element included in the selected memory cell, from the low resistance state to the high resistance state by applying a positive voltage to the second electrode of the variable resistance element with respect to the first electrode of the variable resistance element; and a low-resistance-state write circuit that applies a voltage to the memory cell selected by the selection circuit so as to change the resistance state of the variable resistance element from the high resistance state to the low resistance state by applying a positive voltage to the first electrode with respect to the second electrode, wherein the low-resistance-state write circuit includes a first driving circuit and a second driving circuit both of which apply the voltage to the memory cell, the first driving circuit having an output terminal connected to an output terminal of the second driving circuit, the first driving circuit supplies a first current when the low-resistance-state write circuit applies the voltage to the memory cell, and the second driving circuit (i) supplies a second current when a voltage at the output terminal of the first driving circuit is higher than a predetermined first reference voltage, and (ii) is in a high impedance state when the voltage at the output terminal of the first driving circuit is lower than the first reference voltage, in the case where the low-resistance-state write circuit applies the voltage to the memory cell.

Alternatively, the variable resistance nonvolatile storage device according to another aspect of the present invention is a variable resistance nonvolatile storage device including: a memory cell array including memory cells arranged in a matrix, each of the memory cells including a variable resistance element and a first switch element connected in series with the variable resistance element, the variable resistance element including (i) a first electrode, (ii) a second electrode, and (iii) a nonvolatile variable resistance layer disposed between the first electrode and the second electrode, the nonvolatile variable resistance layer having a resistance state that reversibly changes between a high resistance state and a low resistance state according to a polarity of a voltage to be applied between the first electrode and the second electrode; a selection circuit that selects at least one of the memory cells from the memory cell array; a high-resistance-state write circuit that applies a voltage to the memory cell selected by the selection circuit so as to change a resistance state of the variable resistance element included in the selected memory cell, from the low resistance state to the high resistance state by applying a positive voltage to the second electrode of the variable resistance element with respect to the first electrode of the variable resistance element; and a low-resistance-state write circuit that applies a voltage to the memory cell selected by the selection circuit so as to change the resistance state of the variable resistance element from the high resistance state to the low resistance state by applying a positive voltage to the first electrode with respect to the second electrode, wherein the low-resistance-state write circuit has (i) except for a part of an area, load characteristics in which an output current monotonically decreases according to increase in an output voltage, and (ii) in the part of the area, load characteristics in which the output current increases according to increase in the output voltage.

Thereby, the output VI characteristics (load characteristics) of a low resistance state write circuit are represented by a curve such that the output current increases when an output voltage higher than the first reference voltage is supplied. Thereby, setting a voltage for changing the resistance state of a variable resistance element to the low resistance state as the first reference voltage reduces variations in the current that flows when the variable resistance element is changed to the low resistance state. As a result, variations in the resistance value of the variable resistance element that has been changed to the low resistance state can be suppressed.

Advantageous Effects of Invention

The nonvolatile storage device including memory cells each including a variable resistance element and a selection element (switch element) is provided with the technique enabling (i) suppression of variations in the resistance value of the variable resistance element when the memory cells are in the low resistance state and (ii) securing of a resistance change window (difference in resistance value between the high resistance state and the low resistance state of the variable resistance element) at a maximum. In other words, it is possible to implement the variable resistance nonvolatile storage device in which the resistance change state of the variable resistance element can be stabilized, and which can support increase in the reading speed of the memory cells and improve the yield.

DESCRIPTION OF EMBODIMENTS

Embodiments according to the present invention will be described with reference to drawings.

The variable resistance nonvolatile storage device according to Embodiment 1 in the present invention is a variable resistance nonvolatile storage device that includes variable resistance memory cells each of which includes (i) a variable resistance element whose resistance value reversibly changes based on an electrical signal and (ii) a switch element functioning as a selection element that is connected in series with the variable resistance element, such as a transistor. The variable resistance nonvolatile storage device reduces variations in resistance value of the variable resistance element in its low resistance state to perform stable operations.

[Basic Data of the Variable Resistance Nonvolatile Storage Device According to the Present Invention]

As an introduction, the following will describe basic data from which a new phenomenon relating to a variable resistance element that is a basis of the present invention has been uncovered.

Figure 1:
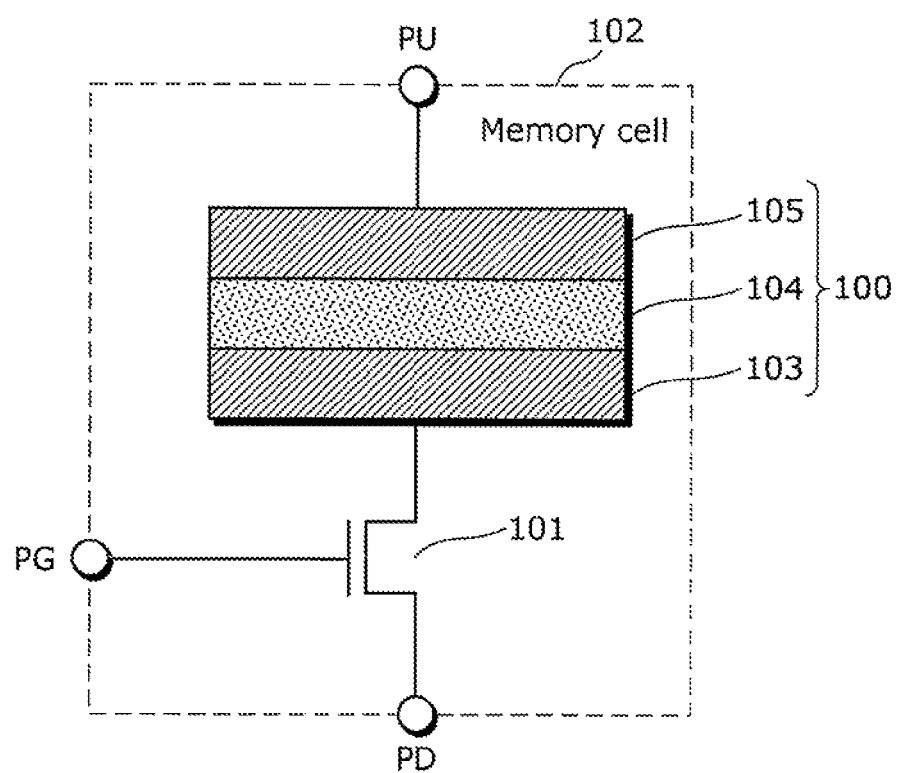
FIG. 1 schematically illustrates a basic structure of a memory cell according to an embodiment in the present invention.
Figure 2:
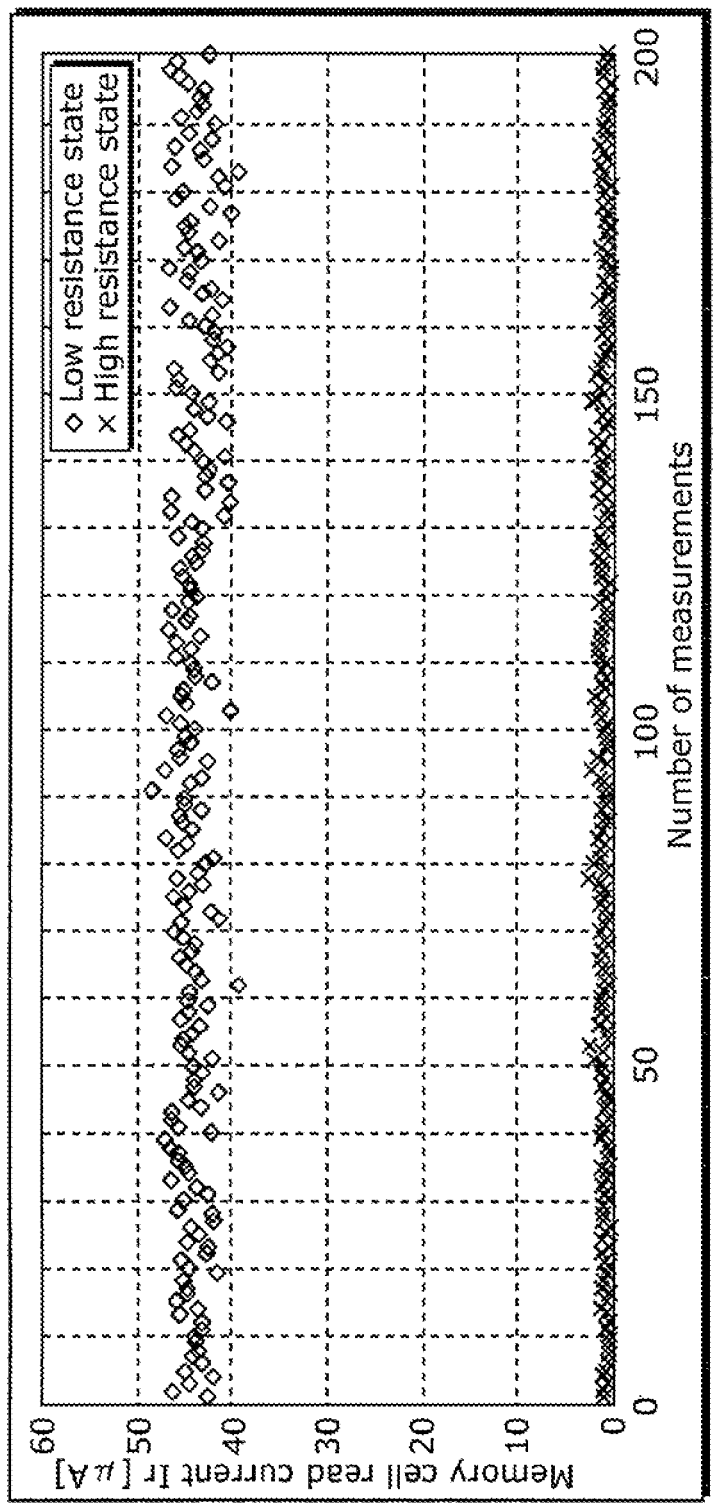
FIG. 2 illustrates a resistance change characteristics graph when positive and negative pulses are alternately applied to a memory cell according to an embodiment in the present invention.

First, when a resistance change operation for changing the resistance state of the variable resistance layer 104 from the high resistance state to the low resistance state was repeatedly performed using the 1T1R memory cell 102 in FIG. 1, variations in resistance change voltage were measured.

Figure 3:
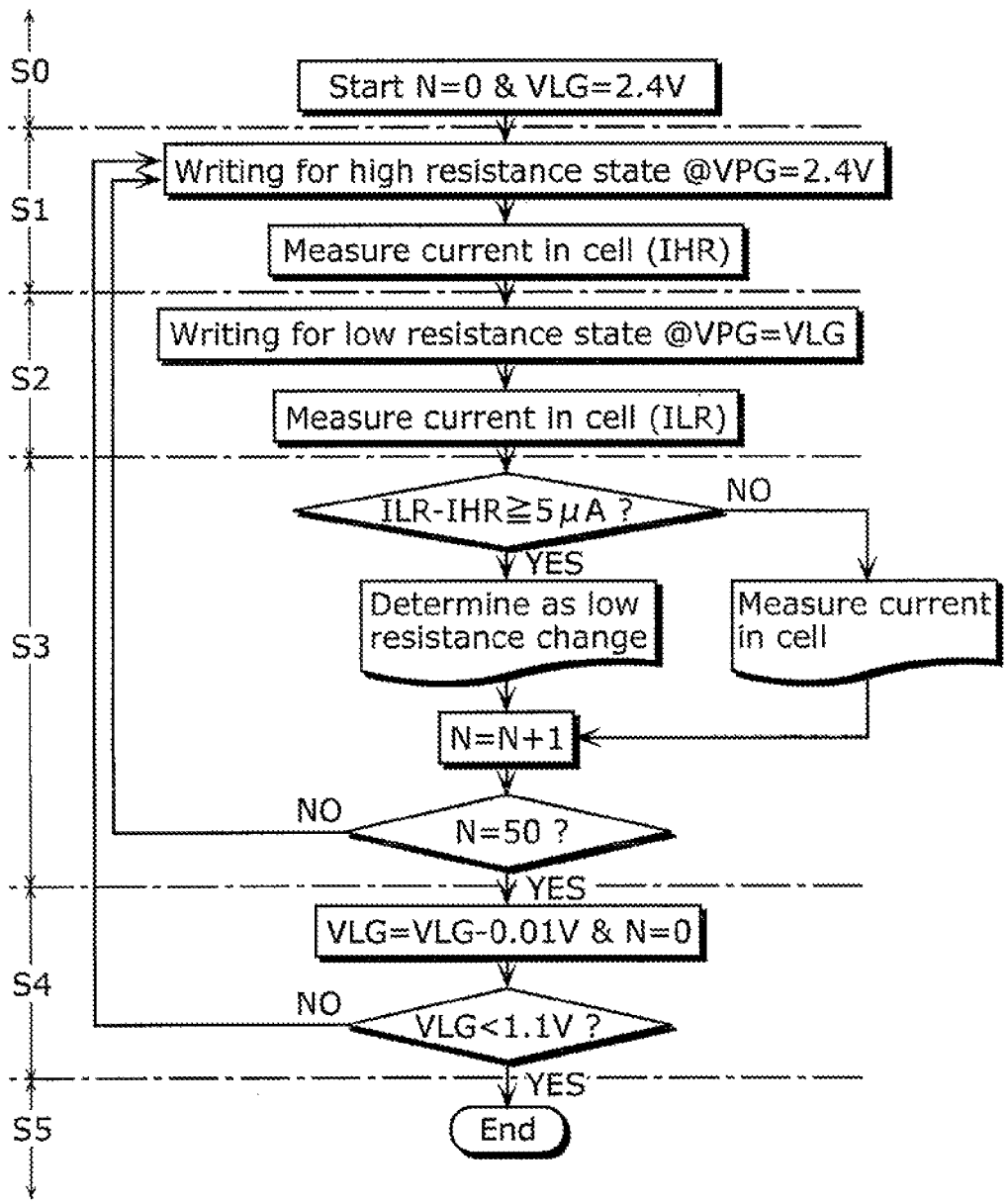
FIG. 3 illustrates a flowchart for writing a memory cell according to an embodiment in the present invention.

FIG. 3 illustrates a flowchart of the measurements, and the procedure divided into Steps S0 to S5 will be described hereinafter.

Step S0 is an initial step of the measurements. N denotes a count parameter indicating a repeat count of resistance changes, and VLG denotes a gate voltage parameter of a voltage value VPG to be provided to the PG terminal that is a gate of the selection transistor 101. Initially, N is set to 0, and VLG is set to a predetermined voltage value. Here, although the initial value of VLG is 2.4 V, the value may be any gate voltage as long as the selection transistor 101 is sufficiently in an ON state with application of a voltage that can sufficiently write, between the PU and PD terminals.

Next, writing for the high resistance state is performed at Step S1. More specifically, pulses with a pulse width of 50 ns are applied with an amplitude of VPG=2.4 V to the PG terminal that is the gate of the selection transistor 101, with an amplitude of 1.8 V to the PU terminal, and with an amplitude of 0 V to the PD terminal. Here, the voltages of 1.8V and VPG=2.4V to be applied between the PU terminal and the PD terminal are examples of voltages that can sufficiently set the variable resistance element 100 to the high resistance state. Next, a current value IHR is measured as a memory cell current when the memory cell 120 is in the high resistance state, with application of 1.8 V to the PG terminal, 0.4 V to the PU terminal, and 0 V to the PD terminal, and the current value IHR is recorded. Here, the voltage 0.4 V to be applied between the PU and PD terminals is a voltage that does not cause any resistance change, regardless of the resistance state of the variable resistance element 100.

Next, writing for the low resistance state is performed at Step S2. More specifically, pulses with a pulse width of 50 ns are applied with an amplitude of a voltage specified by the gate voltage parameter VLG to the PG terminal that is the gate of the selection transistor 101, with an amplitude of 0 V to the PU terminal, and with an amplitude of 1.8 V to the PD terminal. In other words, the pulses reverse to the polarity for the high resistance state are applied between the PU terminal and the PD terminal. Subsequently, a current value ILR is measured as a memory cell current when the memory cell 120 is in the low resistance state, with application of 1.8 V to the PG terminal, 0.4 V to the PU terminal, and 0 V to the PD terminal, and the current value ILR is recorded. Here, the memory cell current is measured under the same condition as the measurement for the high resistance state.

Next, the write state to the memory cell 102 is determined at Step S3. When a difference between the memory cell current value ILR after writing for the low resistance state and the memory cell current value IHR after writing for the high resistance state is not smaller than 5 μA, it is determined at Step S2 that the resistance state is changed to the low resistance state, and otherwise, it is determined that the resistance state is not changed to the low resistance state. After the count parameter N is incremented by 1, Steps S2 and S3 are iterated 50 times from Step S1 again.

Next, the other determination to be iterated is performed at Step S4. After the 50 iterations of Step S3 (N=50), a voltage value of the gate voltage parameter VLG of the voltage value to be provided to the PG terminal that is the gate of the selection transistor 101 is decreased by 0.01 V, and the count parameter N is initialized (N=0). Again, Steps S1 to S3 are similarly iterated. When the gate voltage parameter VLG reaches 1.1 V, the measurements end at Step S5. Here, VLG=1.1 V is a gate voltage such that the resistance of the selection transistor 101 increases, and is a voltage with which the variable resistance element 100 is not set to the low resistance state at all.

Figure 4:
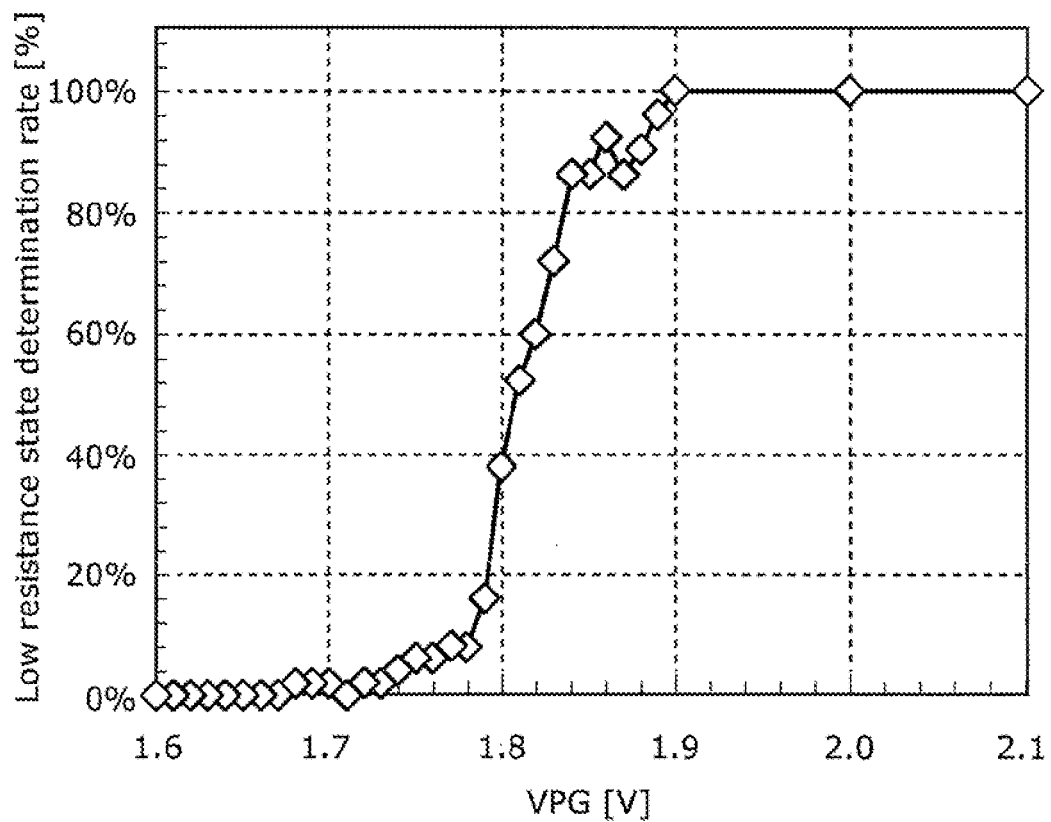
FIG. 4 illustrates a graph of a low resistance state determination rate according to an embodiment in the present invention.

FIG. 4 illustrates a result of measurements on a representative memory cell of 1 bit, according to the procedure indicated in FIG. 3. A region closer to where resistance change occurred with application of VPG=1.6 V to 2.1 V was plotted. The horizontal axis represents the voltage VPG at the gate terminal PG of the selection transistor 101, and the vertical axis represents the low resistance state determination rate obtained by dividing, by 50 that is the number of trials, the number of times it was determined that the resistance state has been changed to the low resistance state at Step S3 in FIG. 3. When the voltage VPG at the gate terminal PG was lower than 1.7 V, no behavior for the low resistance state occurred. However, the resistance state was gradually changed to the low resistance state with application of 1.7 V or a higher voltage. With application of 1.9 V or a higher voltage, the resistance state was completely changed to the low resistance state. In other words, FIG. 4 indicates the probabilistic presence of one of states in the same memory cell with application of the predetermined voltage VPG within a voltage range of 1.7 V to 1.9 V to the gate terminal PG. One of the states is a resistance state which is either changed to the low resistance state or maintained at the high resistance state.

Figure 5:
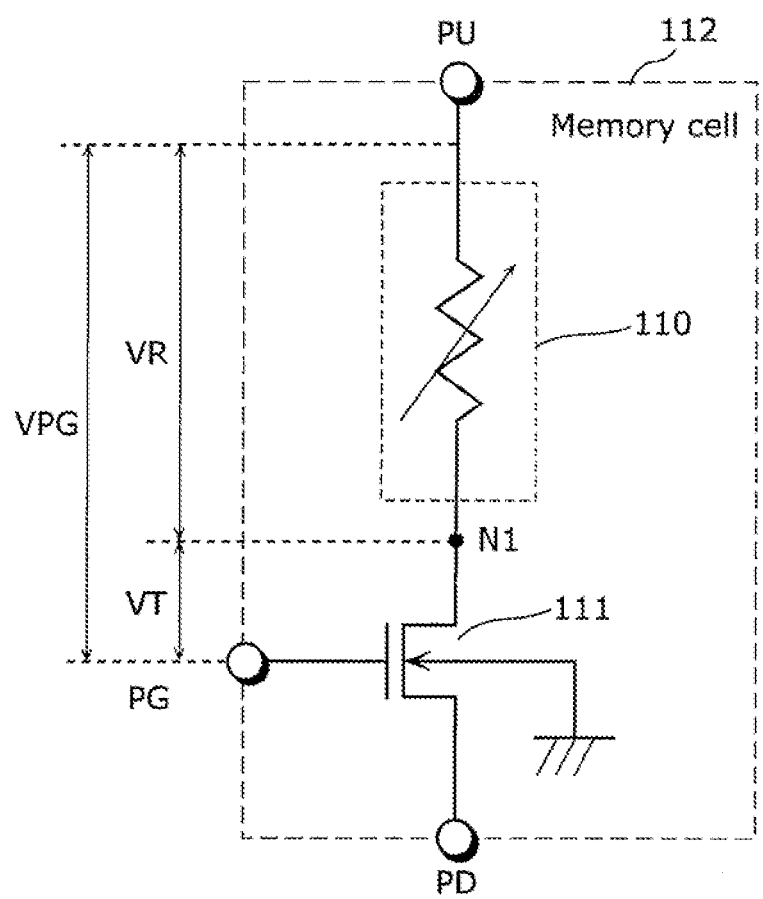
FIG. 5 illustrates an equivalent circuit diagram of a memory cell according to an embodiment in the present invention.

The physical phenomena will be briefly discussed hereinafter. FIG. 5 illustrates an equivalent circuit diagram of the memory cell 102 in FIG. 1. The illustrated memory cell 112 includes the variable resistance element 110 and the selection transistor 111 that are connected in series with each other. The arrow illustrated on the symbol of the variable resistance element 110 indicates a direction of a voltage to be applied for changing the resistance state to the high resistance state. In other words, the resistance state of the variable resistance element 110 is changed to the high resistance state with application of a positive voltage to the terminal PU with respect to a node N1 (conversely, the resistance state is changed to the low resistance state with application of a negative voltage).

When the low resistance state is written at Step S3 in FIG. 3, 1.8 V is applied to the PD terminal and 0 V is applied to the PU terminal, as pulses. The resistance state is changed to the low resistance state when voltages at both ends of the variable resistance element 110 reach a predetermined voltage (hereinafter denoted as a low resistance change voltage VR). The voltage to be applied to the variable resistance element 110 through the selection transistor 111 (voltage at the node N1) is controlled by a voltage at the PG terminal that is the gate of the selection transistor 111. Assuming the threshold voltage of the selection transistor 111 as VT (approximately 1.0 V), 1.8 V is applied to the PD terminal. Since the potential of the node N1 that is a source potential of the selection transistor 111 becomes higher than the substrate potential, up to the voltage (VPG−VT) is applied to the node N1 with the substrate bias effect.

The phenomenon that the resistance state is changed to the low resistance state with application of the predetermined voltage VPG to the gate terminal PG that is the gate terminal of the selection transistor 101 can be approximated by the following equations.

$$VPG-VT=VR \text{ equivalent to:}$$

$$VPG=VR+VT \quad (1)$$

In the measurement result in FIG. 4, the voltage VPG at the PG terminal with which the resistance state is changed to the low resistance state is distributed between 1.7 V and 1.9 V inclusive approximately with a 0.2 V difference. Since the characteristics of transistors have been conventionally well known as very stable, it seems unlikely that the same transistor has such large variations in the threshold voltage VT with the 0.2 V difference for each operation. Thus, it is probable that the low resistance change voltage VR of the variable resistance element 110 varies between 0.7 V and 0.9 V approximately with the 0.2 V difference. As described above, the inventors have found the phenomenon, which has not been conventionally uncovered, that the low resistance change voltage VR varies even in the same variable resistance element 110.

Next, the problem that such variations in resistance change voltage affects the resistance change characteristics will be described.

Figure 6:
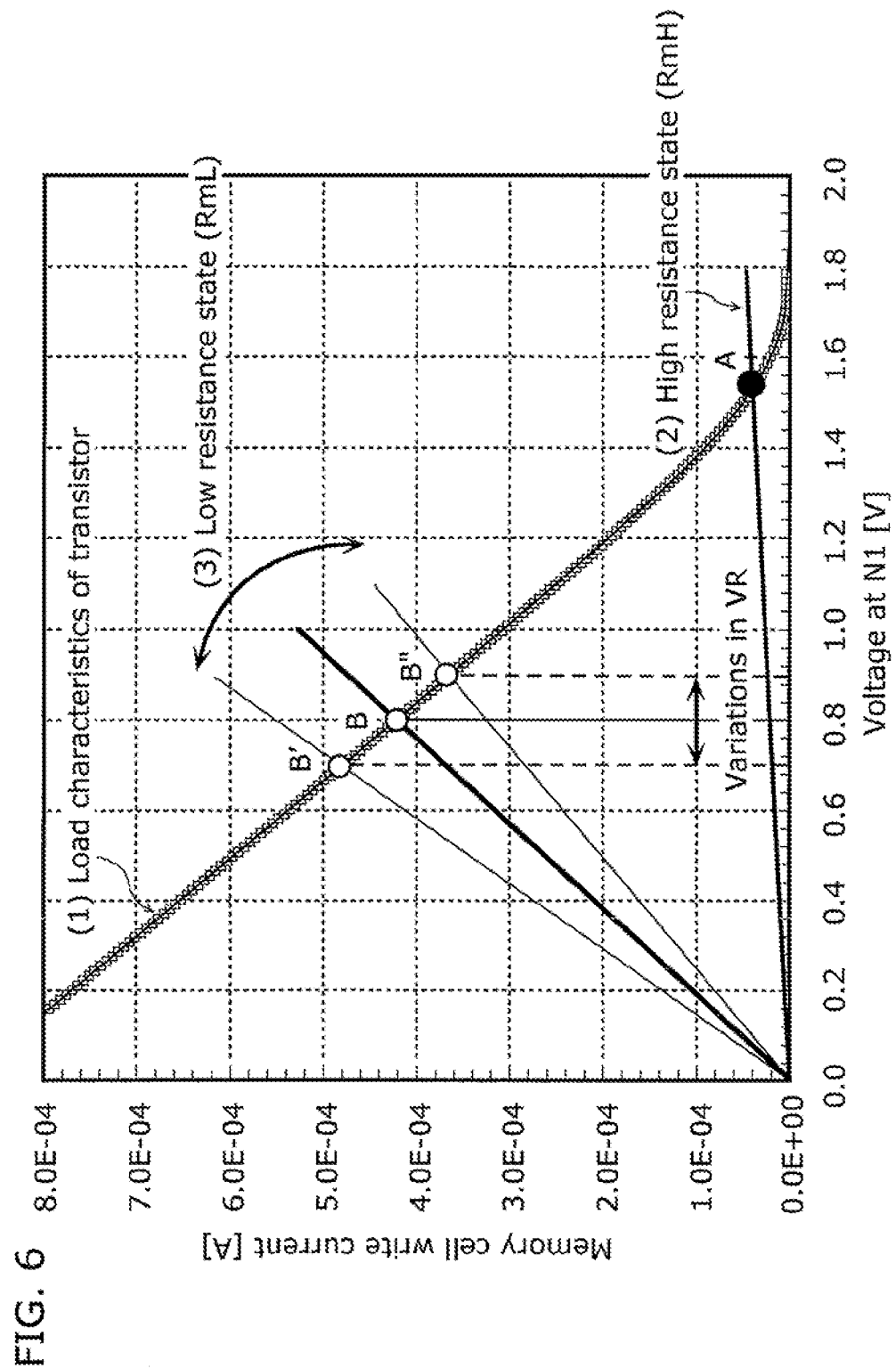
FIG. 6 illustrates an operating point analysis diagram of a memory cell according to an embodiment in the present invention.

Here, the operation for changing the resistance state to the low resistance state with application of a pulse voltage of 2.4 V to the PG terminal, a pulse voltage of 1.8 V to the PD terminal, and a pulse voltage of 0 V to the PU terminal will be discussed. FIG. 6 illustrates an operating point analysis diagram for describing operating points of the variable resistance element 110 and the selection transistor 111 when the resistance state of the memory cell 112 in FIG. 5 is changed from the high resistance state to the low resistance state. The horizontal axis represents the voltage at the node N1 between the variable resistance element 110 and the selection transistor 111 of the memory cell 112, and the vertical axis represents the memory cell write current that flows between the PD terminal and the PU terminal of the memory cell 112.

The characteristics (1) of the selection transistor 111 are represented by a load curve. The load curve indicates the current that flows through the selection transistor 111, that is, the current that flows between the PD terminal and the node N1, when 2.4 V is applied to the PG terminal, 1.8 V is applied to the PD terminal, and the voltage at the node N1 is changed from 0 V to 1.8 V. The characteristics (2) when the variable resistance element 110 is in the high resistance state are also represented by a load line. The load line indicates the current that flows through the variable resistance element 110, that is, the current that flows between the PU terminal and the node N1, when 0 V is applied to the PU terminal and the voltage at the node N1 is changed from 0 V to 1.8 V. Since the selection transistor 111 is connected in series with the variable resistance element 110, a point A at which the currents that flow through the selection transistor 111 and the variable resistance element 110 are equal is an operating point when the variable resistance element 110 is in the high resistance state. The characteristics (3) when the variable resistance element 110 is in the low resistance state are also represented by load lines. When voltages at both ends of the variable resistance element 110 reach the low resistance change voltage VR, the resistance value of the variable resistance element 110 is determined according to the current value of the current that flows through the selection transistor 111. In other words, a point B in the operating point analysis diagram is a point at which the currents that flow through the selection transistor 111 and the variable resistance element 110 are balanced. The slope of the load line at the point B is the resistance value of the variable resistance element 110 in the low resistance state.

Here, the case where the low resistance change voltage VR of the variable resistance element 110 varies will be discussed.

An operating point B' corresponds to an operating point when the low resistance change voltage VR is the smallest, and an operating point B'' corresponds to an operating point when the low resistance change voltage VR is the largest. The slope of the load line at the operating point B' is steeper than that at the operating point B (that is, in a lower resistance state), and the slope of the load line at the operating point B'' is more gradual than that at the operating point B (that is, in a higher resistance state).

In other words, when the low resistance change voltage VR of the variable resistance element 110 varies, the operating points of the selection transistor 111 and the variable resistance element 110 have a point of intersection on a load line with a slope steeper than that in the case where the variable resistance element 110 is in the high resistance state. Thus, the resistance value in a low resistance state to occur significantly varies.

For example, resistance values of 1.7 kΩ to 3.0 kΩ are calculated as the low resistance values to be generated under assumption that a pulse voltage of 2.4 V is applied to the PG terminal that is the gate, a pulse voltage of 1.8 V is applied to the PD terminal, and the low resistance change voltage VR of the variable resistance element 110 varies between 0.7 V (corresponding to the voltage at the operating point B') and 0.9 V (corresponding to the voltage at the operating point B'') inclusive. Thus, the variations range approximately as large as 1.8 times under the assumption. This implies problems, such as reduction in the reading speed and significant obstruction to stable memory operations.

Embodiment 1

Next, a 1T1R variable resistance nonvolatile storage device (hereinafter simply referred to as nonvolatile storage device) using the aforementioned variable resistance element will be described as Embodiment 1 in the present invention for reducing variations in resistance value of a variable resistance element in the low resistance state.

Figure 7:
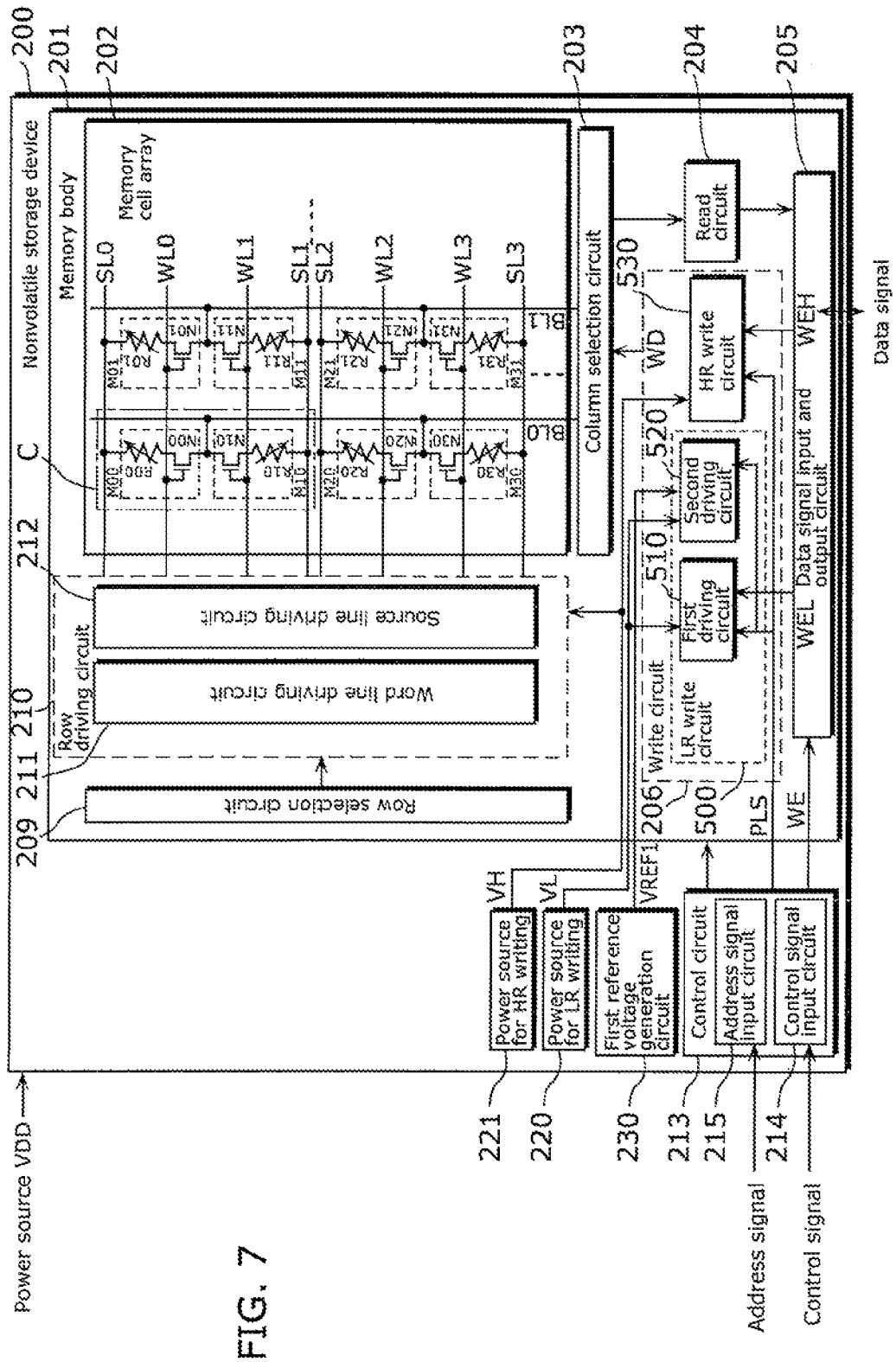
FIG. 7 illustrates a configuration of a nonvolatile storage device according to Embodiment 1 in the present invention.

FIG. 7 is a block diagram illustrating a configuration of a nonvolatile storage device according to Embodiment 1 in the present invention.

As illustrated in FIG. 7, a nonvolatile storage device 200 according to Embodiment 1 includes a memory body 201 on a semiconductor substrate. The memory body 201 includes a memory cell array 202; a column selection circuit 203; a read circuit 204 which detects an amount of a current flowing through a selected bit line and determines whether stored data indicates "1" or "0"; a data signal input and output circuit 205 which performs input and output processes on a data signal; and a write circuit 206 for writing data. The write circuit 206 includes an LR write circuit 500 including a first driving circuit 510 and a second driving circuit 520, and an HR write circuit 530. Furthermore, the nonvolatile storage device 200 includes a row selection circuit 209 and a row driving circuit 210. The row driving circuit 210 includes a word line driving circuit 211 and a source line driving circuit 212. The word line driving circuit 211 drives a word line selected by the row selection circuit 209, and the source line driving circuit 212 drives a source line selected by the row selection circuit 209. The column selection circuit 203 and the row selection circuit 209 compose a selection circuit that selects at least one of memory cells included in the memory cell array 202. Furthermore, LR denotes "low resistance" or "low resistance state", and HR denotes "high resistance" or "high resistance state".

Furthermore, the nonvolatile storage device 200 includes a control circuit 213 that controls an operation of the memory body 201. The control circuit 213 includes a control signal input circuit 214 that receives a control signal from outside of the nonvolatile storage device 200, and an address signal input circuit 215 that receives address signals from the same.

The nonvolatile storage device 200 includes, as power sources for writing, (i) a power source for low resistance (LR) writing 220 that supplies a voltage for changing the resistance state of a variable resistance element from the high resistance state to the low resistance state, and (ii) a power source for high resistance (HR) writing 221 that supplies a voltage for changing the resistance state of the variable resistance element from the low resistance state to the high resistance state. The power source for LR writing 220 supplies an output voltage VL to the first driving circuit 510 and the second driving circuit 520, and the power source for HR writing 221 supplies an output voltage VH to the HR write circuit 530 and the row driving circuit 210. Furthermore, the nonvolatile storage device 200 includes a first reference voltage generation circuit 230 that generates a predetermined first reference voltage VREF1 having a predetermined relationship with the low resistance change voltage VR. The first reference voltage generation circuit 230 supplies the generated first reference voltage VREF1 to the second driving circuit 520 as a reference for comparison by the second driving circuit 520.

The memory cell array 202 includes on the semiconductor substrate: word lines WL0, WL1, WL2, WL3, . . . and bit lines BL0, BL1, . . . that are arranged to intersect with each other; NMOS transistors N00, N01, N10, N11, N20, N21, N30, N31, . . . as selection elements (first switch elements) that are provided respectively to correspond to points of intersection of the word lines WL0, WL1, WL2, WL3, . . . and the bit lines BL0, BL1, . . . ; and variable resistance elements R00, R01, R10, R11, R20, R21, R30, R31, . . . that are respectively connected in series with the NMOS transistors N00, N01, N10, N11, N20, N21, N30, N31, . . . . The NMOS transistors N00, N01, N10, N11, N20, N21, N30, N31, . . . and the variable resistance elements R00, R01, R10, R11, R20, R21, R30, R31, . . . that are connected in series with the NMOS transistors N00, N01, N10, N11, N20, N21, N30, N31, . . . compose series circuits included in memory cells M00, M01, M10, M11, M20, M21, M30, M31, . . . , respectively. The memory cells are arranged in a matrix.

As illustrated in FIG. 7, gates of the NMOS transistors N00, N01, . . . are connected to the word line WL0, gates of the NMOS transistors N10, N11, . . . are connected to the word line WL1, gates of the NMOS transistors N20, N21, . . . are connected to the word line WL2, and gates of the NMOS transistors N30, N31, . . . are connected to the word line WL3.

Furthermore, the NMOS transistors N00, N10, N20, N30, . . . are connected to the bit line BL0, and the NMOS transistors N01, N11, N21, N31, . . . are connected to the bit line BL1.

Furthermore, the variable resistance elements R00, R01, . . . are connected to the source line SL0, the variable resistance elements R10, R11, . . . are connected to the source line SL1, the variable resistance elements R20, R21, . . . are connected to the source line SL2, and the variable resistance elements R30, R31, . . . are connected to the source line SL3.

The address signal input circuit 215 receives address signals from an external circuit (not illustrated), and outputs, based on the address signals, (i) row address signals to the row selection circuit 209, and (ii) column address signals to the column selection circuit 203. Here, the address signals are signals each indicating an address to of a specific memory cell to be selected from among the memory cells M00, M01, . . . .

The control signal input circuit 214 receives a control signal that controls an operation of the memory body 201, and outputs a signal for controlling each circuit block through the control circuit 213.

In a data write cycle, the control circuit 213 outputs a write pulse signal PLS to the LR write circuit 500 and the HR write circuit 530, and outputs a write enable signal WE for controlling write, to the data signal input and output circuit 205. The data signal input and output circuit 205 outputs, according to a data signal from an external circuit (not illustrated), (i) an LR write enable signal WEL to the LR write circuit 500 when performing L data writing (setting the variable resistance element to the low resistance state), and (ii) an HR write enable signal WEH to the HR write circuit 530 when performing H data writing (setting the variable resistance element to the high resistance state). Furthermore, in a data read cycle, data signals outputted from a memory cell selected by the column selection circuit 203 and the row selection circuit 209 are outputted to the data signal input and output circuit 205 through the read circuit 204.

The row selection circuit 209 receives column address signals from the address signal input circuit 215, and applies a predetermined voltage to a corresponding one of the word lines WL0, WL1, WL2, WL3, . . . through the word line driving circuit 211, according to the received column address signals.

Similarly, the row selection circuit 209 receives row address signals from the address signal input circuit 215, and applies a predetermined voltage to a corresponding one of the source lines SL0, SL1, SL2, SL3, . . . through the source line driving circuit 212, according to the received column address signals.

The column selection circuit 203 receives row address signals from the address signal input circuit 215, selects one of the bit lines BL0, BL1, . . . according to the selected row address signals, applies a voltage for writing or a voltage for reading to the selected bit line, and applies a non-selected voltage to a bit line that is not selected.

Upon receipt of the write pulse signal PLS instructing application of the write voltage from the control circuit 213, the write circuit 206 supplies a write voltage that is a voltage set according to a write mode, to a bit line selected by the column selection circuit 203.

In a data read cycle, the read circuit 204 detects an amount of a current flowing through a selected bit line to be read and determines whether stored data indicates "1" or "0". The read circuit 204 outputs the resulting determination data to an external circuit (not illustrated) through the data signal input and output circuit 205.

Figure 8:
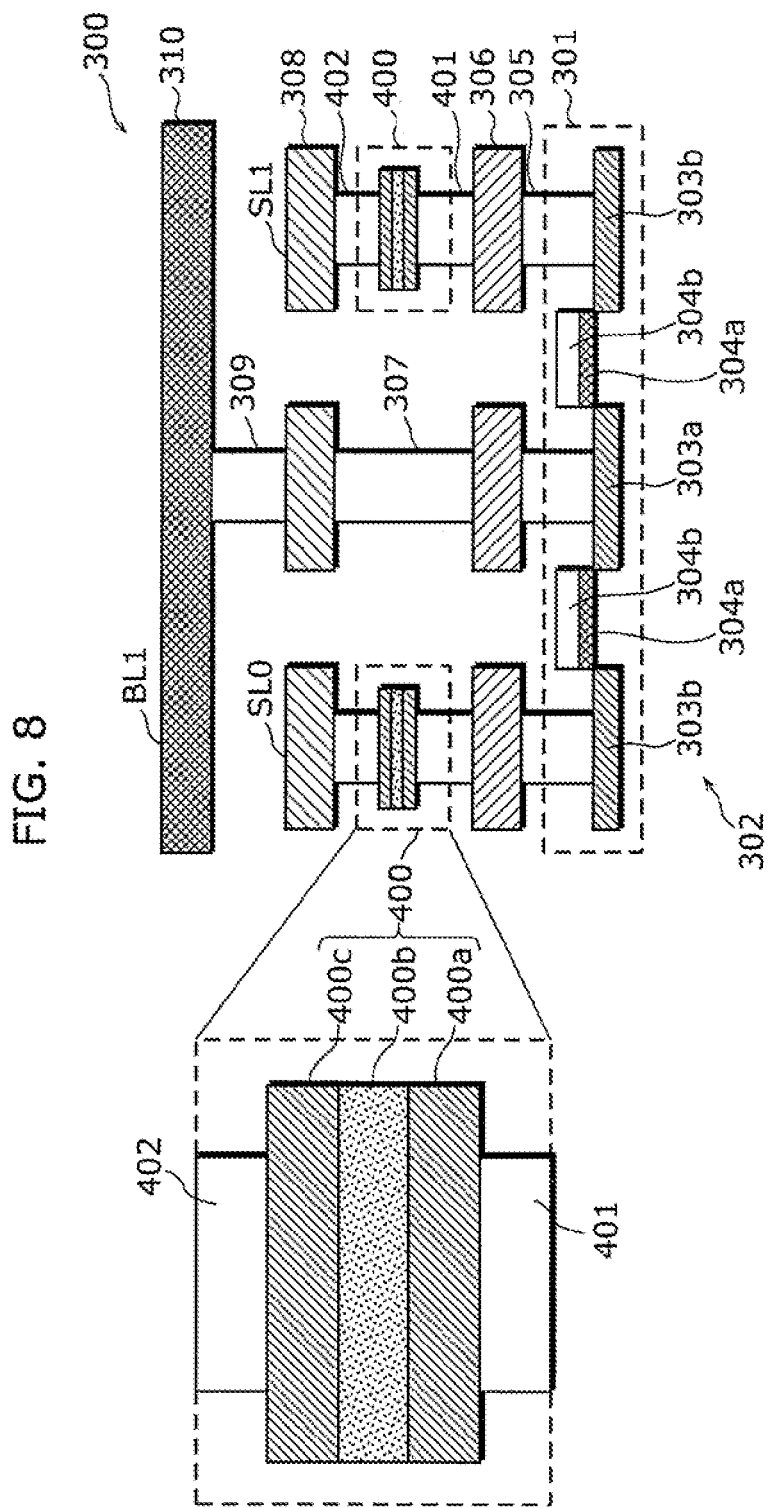
FIG. 8 illustrates an example of a cross section of a structure of a memory cell in a variable resistance nonvolatile storage device according to Embodiment 1 in the present invention.

FIG. 8 illustrates an example of a cross section of a structure of a memory cell 300 (2 bits) corresponding to a portion C in FIG. 7, and an example of an enlarged view of a variable resistance element 400.

An NMOS transistor 301 corresponds to the NMOS transistors N01 and N11 in FIG. 7, and the variable resistance element 400 corresponds to the variable resistance elements R01 and R11 in FIG. 7.

The NMOS transistor 301 includes, on a semiconductor substrate 302, a first N-type diffusion layer region 303a, second N-type diffusion layer regions 303b, gate insulator films 304a, and gate electrodes 304b. Furthermore, a first via 305, a first wiring layer 306, a second via 307, a second wiring layer 308, a third via 309, and a third wiring layer 310 are sequentially formed on the first N-type diffusion layer region 303a. On the other hand, another first via 305, another first wiring layer 306, another lower electrode connection via 401, the variable resistance element 400, a upper electrode connection via 402, and a second wiring layer 308 are sequentially formed on the second N-type diffusion layer region 303b. Although Embodiment 1 describes an example in which the variable resistance element 400 is formed between the first wiring layer 306 and the second wiring layer 308, the variable resistance element 400 may be formed between any other wiring layers.

The third wiring layer 310 corresponds to the bit line BL1. The first wiring layer 306 and the second wiring layer 308 that are connected to the variable resistance element 400 are wiring layers that extend perpendicular to the drawing. The second wiring layers 308 correspond to the source lines SL0 and SL1.

The voltage at the semiconductor substrate 302 is 0 V, and the semiconductor substrate 302 is connected to a ground potential using a commonly-known structure through a ground power source line (not illustrated).

As illustrated in the enlarged view of FIG. 8, the variable resistance element 400 is formed by stacking, on the lower electrode connection via 401, the lower electrode 400a, the variable resistance layer 400b, and the upper electrode 400c, and is connected to the upper electrode connection via 402 which is connected to the second wiring layer 308.

Here, the variable resistance layer 400b includes an oxygen-deficient transition metal oxide layer, such as an oxygen-deficient Ta oxide layer, and the lower electrode 400a and the upper electrode 400c comprise materials having different standard electrode potentials. The lower electrode 400a comprises an electrode material (material lower in standard electrode potential than that of the upper electrode 400c), such as tantalum nitride (TaN), and is connected to the second N-type diffusion layer region 303b through the lower electrode connection via 401. The electrode material does not easily cause a resistance change at an interface between the variable resistance layer 400b and the lower electrode 400a. Furthermore, the upper electrode 400c comprises an electrode material (material higher in standard electrode potential than a metal comprised in the variable resistance layer 400b), such as platinum (Pt), and is connected to the source line SL0 or SL1 formed in the second wiring layer 308, through the upper electrode connection via 402. The electrode material easily causes a resistance change at an interface between the variable resistance layer 400b and the upper electrode 400c.

According to Embodiment 1, the upper electrode 400c comprises Pt whose standard electrode potential is higher, and the lower electrode 400a comprises TaN whose standard electrode potential is lower than Pt. The resistance state of the variable resistance layer 400b is changed to the low resistance state with application of a high potential to the lower electrode 400a and a low potential to the upper electrode 400c. In order to apply the high potential to the lower electrode 400a and the low potential to the upper electrode 400c, the first driving circuit 510 and the second driving circuit 520 apply the high potential to a corresponding one of the bit lines, and the source line driving circuit 212 applies the low potential to a corresponding one of the source lines.

Here, the lower electrode 400a, the variable resistance layer 400b, and the upper electrode 400c may comprise any materials as long as: the variable resistance layer 400b includes an oxygen-deficient transition metal oxide layer comprising one of tantalum (Ta) and hafnium (Hf); the lower electrode 400a and the upper electrode 400c comprise materials having different standard electrode potentials; and the materials satisfy Vt<V2 and V1<V2, assuming that V1 denotes the standard electrode potential of the lower electrode 400a, V2 denotes the standard electrode potential of the upper electrode 400c, and Vt denotes the standard electrode potential of one of Ta and Hf comprised in the variable resistance layer 400b.

More specifically, when the variable resistance layer 400b is an oxygen-deficient tantalum oxide layer, the upper electrode 400c desirably comprises one of Pt, Ir, Pd, Ag, Cu, and Au, and the lower electrode 400a desirably comprises one of TaN, W, Ni, Ta, Ti, and Al.

Furthermore, when the variable resistance layer 400b is an oxygen-deficient hafnium oxide layer, the upper electrode 400c desirably comprises one of W, Cu, Pt, and Au, and the lower electrode 400a desirably comprises one of Al, Ti, and Hf.

As described in Basic data of the present invention, the low resistance change voltage VR of the variable resistance element 400 comprising such materials has variations that are not conventionally known, and the variations range from 0.7 V to 0.9 V with the 0.2 V difference.

Figure 9:
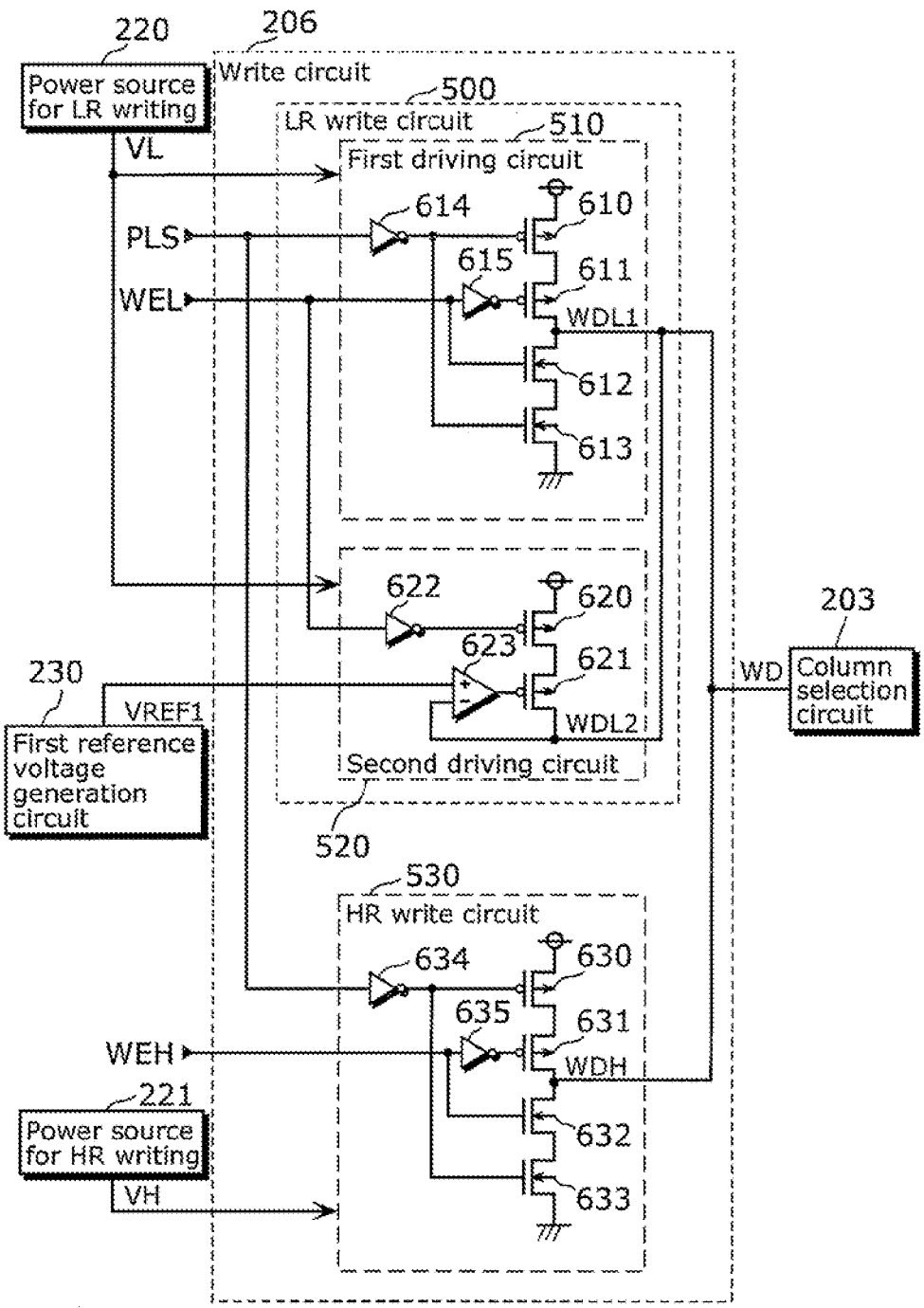
FIG. 9 illustrates a configuration of a write circuit according to Embodiment 1 in the present invention.

FIG. 9 is a circuit diagram illustrating a specific example of a circuit configuration of the write circuit 206 according to Embodiment 1 in the present invention, and a circuit diagram indicating the power source for LR writing 220, the power source for HR writing 221, the first reference voltage generation circuit 230, and the connection relationship between these elements. As illustrated in FIG. 9, the write circuit 206 includes an LR write circuit 500 that applies a voltage and a current to the memory cells for changing the resistance state of the variable resistance elements R00, R01, . . . from the high resistance state to the low resistance state, and an HR write circuit 530 that applies a voltage and a current to the memory cells for changing the resistance state of the variable resistance elements R00, R01, . . . from the low resistance state to the high resistance state.

The LR write circuit 500 is an example of a low-resistance-state write circuit that applies a voltage to a memory cell selected by the row selection circuit 209 and the column selection circuit 203 so as to change a resistance state of a corresponding one of the variable resistance elements R00 and others included in the selected memory cell from the high resistance state to the low resistance state by applying a positive voltage to the first electrode (lower electrode 400a) with respect to the second electrode (upper electrode 400c) of the variable resistance element. The LR write circuit 500 includes the first driving circuit 510 and the second driving circuit 520.

The first driving circuit 510 is a circuit that supplies a first current when the LR write circuit 500 applies a voltage for changing the resistance state of a memory cell to the low resistance state, and includes a PMOS 610, a PMOS 611, an NMOS 612, an NMOS 613, an inverter 614, and an inverter 615. Simply, "PMOS" refers to "PMOS transistor", and "SMOS" refers to "SMOS transistor".

The PMOS 610, the PMOS 611, the NMOS 612, and the NMOS 613 have main terminals (drain terminals or source terminals) connected in series with each other in this order, and form a single current path. One of the two main terminals of the PMOS 610 that is not connected to any terminal of the PMOS 611 (source terminal) is connected to a power source (for example, the power source for LR writing 220). Furthermore, one of the two main terminals of the NMOS 613 that is not connected to any terminal of the NMOS 612 (source terminal) is connected to a ground potential.

The data signal input and output circuit 205 outputs the LR write enable signal WEL to an input terminal of the inverter 615 and to a gate of the NMOS 612, and the inverter 615 outputs the LR write enable signal WEL received through the input terminal, to a gate of the PMOS 611 as an inversion signal. The control circuit 213 outputs the pulse signal PLS to an input terminal of the inverter 614, and the inverter 614 outputs the pulse signal PLS received through the input terminal, to respective gates of the PMOS 610 and of the NMOS 613 as inversion signals. The main terminals of the PMOS 611 and the NMOS 612 (drain terminals) are connected to each other, and a signal is output through an output terminal WDL1 of the first driving circuit 510.

The first driving circuit 510 supplies one of a VL potential and a ground potential (VSS) supplied from the power source for LR writing 220, according to the write pulse signal PLS, when the LR write enable signal WEL is in the high (H) state. The first driving circuit 510 provides a high impedance (hereinafter also referred to as Hi-Z) state from the output terminal WDL1, when the LR write enable signal WEL is in the low (L) state.

Here, the output driving current (a first current) from the first driving circuit 510 is determined according to the current capability of a serial path composed of the PMOS 610 and the PMOS 611. Controlling the driving current allows control of the current that flows through the variable resistance element R00. The output driving current from the first driving circuit 510 is controlled to be smaller than the driving current from the selection transistor N00. For example, the control can be implemented by reducing gate widths of the PMOS 610 and the PMOS 611 or increasing the gate lengths of the PMOS 610 and the PMOS 611. Furthermore, the control can be implemented by integrating a current limiting circuit into the power source for LR writing 220.

The second driving circuit 520 includes a PMOS 620, a PMOS 621 serving as the first driving element, an inverter 622, and a voltage comparator circuit 623 serving as the first comparator circuit. In the case where the LR write circuit 500 applies a voltage to a memory cell for changing the resistance state to the low resistance state, when a voltage at the output terminal WDL1 of the first driving circuit 510 is higher than the predetermined first reference voltage VREF1, the second driving circuit 520 supplies a second current. When a voltage at the output terminal WDL2 of the second driving circuit 520 is lower than the predetermined first reference voltage VREF1, the second driving circuit 520 is in the high impedance state. The PMOS 620 and the PMOS 621 have main terminals (drain terminals or source terminals) connected in series with each other in this order, and form a single current path. One of the two main terminals of the PMOS 620 that is not connected to any terminal of the PMOS 621 (source terminal) is connected to a power source (for example, the power source for LR writing 220). Furthermore, one of the two main terminals of the PMOS 621 that is not connected to any terminal of the PMOS 620 (drain terminal) is connected to one of the two input terminals of the voltage comparator circuit 623 (for example, negative terminal), and is also connected to the output terminal WDL2 of the second driving circuit 520. Here, the output terminal WDL1 of the first driving circuit 510 is connected to the output terminal WDL2 of the second driving circuit 520.

The output terminal of the voltage comparator circuit 623 is connected to the gate terminal of the PMOS 621. Furthermore, the other one of the input terminals of the voltage comparator circuit 623 (for example, positive terminal) is connected to the output terminal of the first reference voltage generation circuit 230, and the first reference voltage VREF1 is applied to the input terminal. The voltage comparator circuit 623 compares the first reference voltage VREF1 input to the positive terminal, with a voltage obtained by feeding back, into the negative terminal, the voltage at the output terminal WDL1 of the driving circuit 510 connected to the output terminal WDL2 of the second driving circuit 520. When the first reference voltage VREF1 is higher than the feedback voltage, the output from the voltage comparator circuit 623 is equal to the VL potential supplied from the power source for LR writing 220, and thus, the PMOS 621 is placed in an OFF state, and the output terminal WDL2 of the second driving circuit 520 is placed in the Hi-Z state. Furthermore, the voltage comparator circuit 623 compares the first reference voltage VREF1 input to the positive terminal, with a voltage obtained by feeding back, into the negative terminal, the voltage at the output terminal WDL1 of the driving circuit 510 connected to the output terminal WDL2 of the second driving circuit 520. When the first reference voltage VREF1 is lower than the feedback voltage, the output from the voltage comparator circuit 623 is equal to the ground potential (VSS), and thus, the PMOS 621 is placed in an ON state. When the PMOS 620 is in the ON state, the potential of the source terminal of the PMOS 620, that is, the VL potential is supplied from the power source for LR writing 220 to the output terminal WDL2 of the second driving circuit 520. Thereby, the second current is supplied. When the output terminal WDL1 has the same potential as the first reference voltage VREF1, the voltage comparator circuit 623 may be set to output one of the VL potential and the ground potential (or output may not be defined).

Furthermore, the data signal input and output circuit 205 outputs the LR write enable signal WEL to the input terminal of the inverter 622, and the inverter 622 outputs the LR write enable signal WEL to the gate of the PMOS 620 as an inversion signal.

When the LR write enable signal WEL is in the H state, the second driving circuit 520 provides the Hi-Z state from the output terminal WDL2 as described above, or the power source for LR writing 220 supplies the VL potential to the output terminal WDL2 of the second driving circuit 520, according to a relationship between voltages of the two input terminals of the voltage comparator circuit 623. Furthermore, when the LR write enable signal WEL is in the L state, the second driving circuit 520 provides the Hi-Z state from the output terminal WDL2.

The HR write circuit 530 is an example of a high-resistance-state write circuit that applies a voltage to a memory cell selected by the row selection circuit 209 and the column selection circuit 203 so as to change a resistance state of a corresponding one of the variable resistance elements R00 and others included in the selected memory cell from the low resistance state to the high resistance state by applying a positive voltage to the second electrode (upper electrode 105) with respect to the first electrode (lower electrode 103) of the variable resistance element. The HR write circuit 530 includes a PMOS 630, a PMOS 631, an NMOS 632, an NMOS 633, an inverter 634, and an inverter 635.

The PMOS 630, the PMOS 631, the NMOS 632, and the NMOS 633 have main terminals (drain terminals or source terminals) connected in series with each other in this order, and form a single current path. One of the two main terminals (source terminal) of the PMOS 630 that is not connected to any terminal of the PMOS 631 is connected to a power source (for example, the power source for HR writing 221). Furthermore, one of the two main terminals of the NMOS 633 that is not connected to any terminal of the NMOS 632 (source terminal) is connected to a ground potential.

The data signal input and output circuit 205 outputs the HR write enable signal WEH to an input terminal of the inverter 635 and to a gate of the NMOS 632, and the inverter 635 outputs the HR write enable signal WEL received through the input terminal, to a gate of the PMOS 631 as an inversion signal. Furthermore, the control circuit 213 outputs the pulse signal PLS to an input terminal of the inverter 634, and the inverter 634 outputs the pulse signal PLS received through the input terminal, to respective gates of the PMOS 630 and of the NMOS 633 as inversion signals. The main terminals of the PMOS 631 and the NMOS 632 (drain terminals) are connected to each other, and a signal is output through an output terminal WDH of the HR write circuit 530.

When the HR write enable signal WEH is in the H state, the HR write circuit 530 outputs, from the output terminal WDH, an output signal corresponding to one of the ground potential (VSS) and the VH potential supplied from the power source for HR writing 221, according to the pulse signal PLS output from the control circuit 213. When the HR write enable signal WEH is in the L state, the HR write circuit 530 provides the Hi-Z state.

Each of the output terminal WDL1 of the first driving circuit 510, the output terminal WDL2 of the second driving circuit 520, and the output terminal WDH of the HR write circuit 530 is connected to an output terminal WD of the write circuit 206, and a signal at the output terminal WD of the write circuit 206 drives a bit line selected by the column selection circuit 203.

Next, an example of operations of the nonvolatile storage device 200 having such a structure in the write cycle when data in the low resistance state is written thereto will be described with reference to a timing chart in FIG. 10. The timing chart schematically and simply illustrates the operations, but does not illustrate actual voltages and current waveforms.

Figure 10:
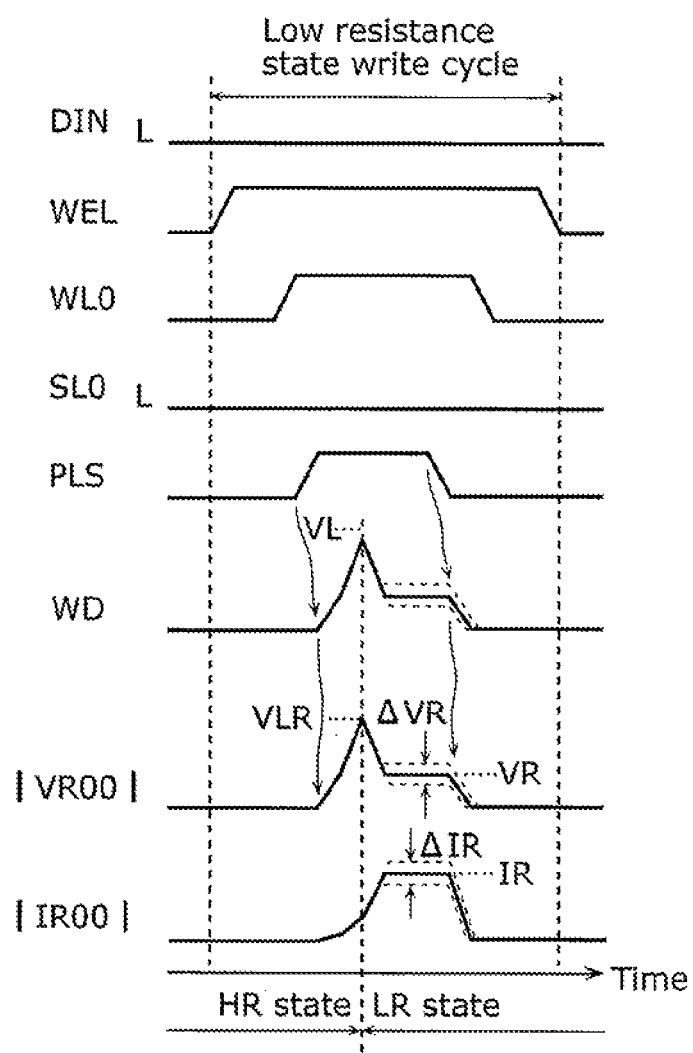
FIG. 10 illustrates an operation timing chart of a memory cell according to Embodiment 1 in the present invention.

FIG. 10 illustrates the example of operations, assuming that data "1" represents a case where a variable resistance layer is in the high resistance state, and data "0" represents a case where a variable resistance layer is in the low resistance state. Furthermore, the following describes a case where data is read from and written to the memory cell M00 in FIG. 7. Furthermore, the power source for LR writing 220 supplies the potential VL. Furthermore, the first reference voltage generation circuit 230 supplies the first reference voltage VREF1 that is set to a voltage to be applied as the low resistance change voltage VR to both ends of the variable resistance element R00 when the resistance state of the variable resistance element R00 is changed to the low resistance state.

Since the data signal input and output circuit 205 receives the low potential as input data DIN in the write cycle of the low resistance state (data "0") in FIG. 10, when the control circuit 213 outputs a write enable signal WE to the data signal input and output circuit 205, the LR write enable signal WEL of the data signal input and output circuit 205 is set to the high potential. After the selected word line WL0 is activated, the NMOS transistor N00 of the memory cell M00 is turned on. At this stage, since 0 V is applied to both the source line SL0 and the bit line BL0, any current does not flow through the lines.

Next, with activation of the write pulse signal PLS, the power source for LR writing 220 supplies the potential VL to the output terminal WDL1 of the first driving circuit 510. At the same time, when a voltage at the output terminal WDL1 of the first driving circuit 510 exceeds the first reference voltage VREF1, the write circuit 206 supplies, from its output terminal WD, the potential VL that is supplied also from the second driving circuit 520.

Next, when the absolute value |VR00| of a voltage at both ends of the variable resistance element R00 reaches closer to VLR, the resistance state of the variable resistance element R00 is changed from the high resistance state to the low resistance state. Thus, the absolute value |VR00| of the voltage at both ends of the variable resistance element R00 becomes the low resistance change voltage VR, and the absolute value |IR00| of a current that flows through the variable resistance element R00 becomes a low resistance change current IR. Here, since the low resistance change voltage VR varies, the low resistance change current IR also varies. Assuming that ΔVR denotes variations in the low resistance change voltage VR and ΔIR denotes variations in the low resistance change current IR, the resistance LR of the variable resistance element R00 in the low resistance state is expressed by the following equation (2).

$$LR=(VR\pm\Delta VR)/(IR\pm\Delta IR) \quad (2)$$

As illustrated in FIG. 6, when the low resistance change voltage VR (operating point B) is changed in a positive direction (VR+ΔVR, that is, operating point B") with the variations ΔVR in the low resistance change voltage VR, the low resistance change current IR decreases (IR−ΔIR) in the conventional write circuit. Thus, the resistance value LR (+) of the variable resistance element R00 greatly increases as indicated by the following Equation (3). When the low resistance change voltage VR is changed in a negative direction (VR−ΔVR, that is, operating point B') with the variations ΔVR in the low resistance change voltage VR, the low resistance change current IR increases (IR+ΔIR). Thus, the resistance value LR (−) of the variable resistance element R00 greatly decreases as indicated by the following Equation (4).

$$LR(+)=(VR+\Delta VR)/(IR-\Delta IR) \quad (3)$$

$$LR(-)=(VR-\Delta VR)/(IR+\Delta IR) \quad (4)$$

In contrast, when the absolute value |VR00| of the voltage at both ends of the variable resistance element R00 is equal to or larger than VR, since the second driving circuit 520 according to the present invention supplies the high potential as described above, the low resistance change current IR accordingly increases. Thereby, when the low resistance change voltage VR is changed in the positive direction (VR+ΔVR) with the variations ΔVR in the low resistance change voltage VR, the low resistance change current IR increases (IR+ΔIR). Thus, change in the resistance value LR' (+) of the variable resistance element R00 is smaller than LR(+) as indicated by the following Equation (5). On the other hand, when the low resistance change voltage VR is changed in the negative direction (VR−ΔVR) with the variations ΔVR in the low resistance change voltage VR, the low resistance change current IR decreases (IR−ΔIR). Thus, change in the resistance value LR' (−) of the variable resistance element R00 is smaller than LR(−) as indicated by the following Equation (6).

$$LR'(+)=(VR+\Delta VR)/(IR+\Delta IR) \quad (5)$$

$$LR'(-)=(VR-\Delta VR)/(IR-\Delta IR) \quad (6)$$

Figure 11:
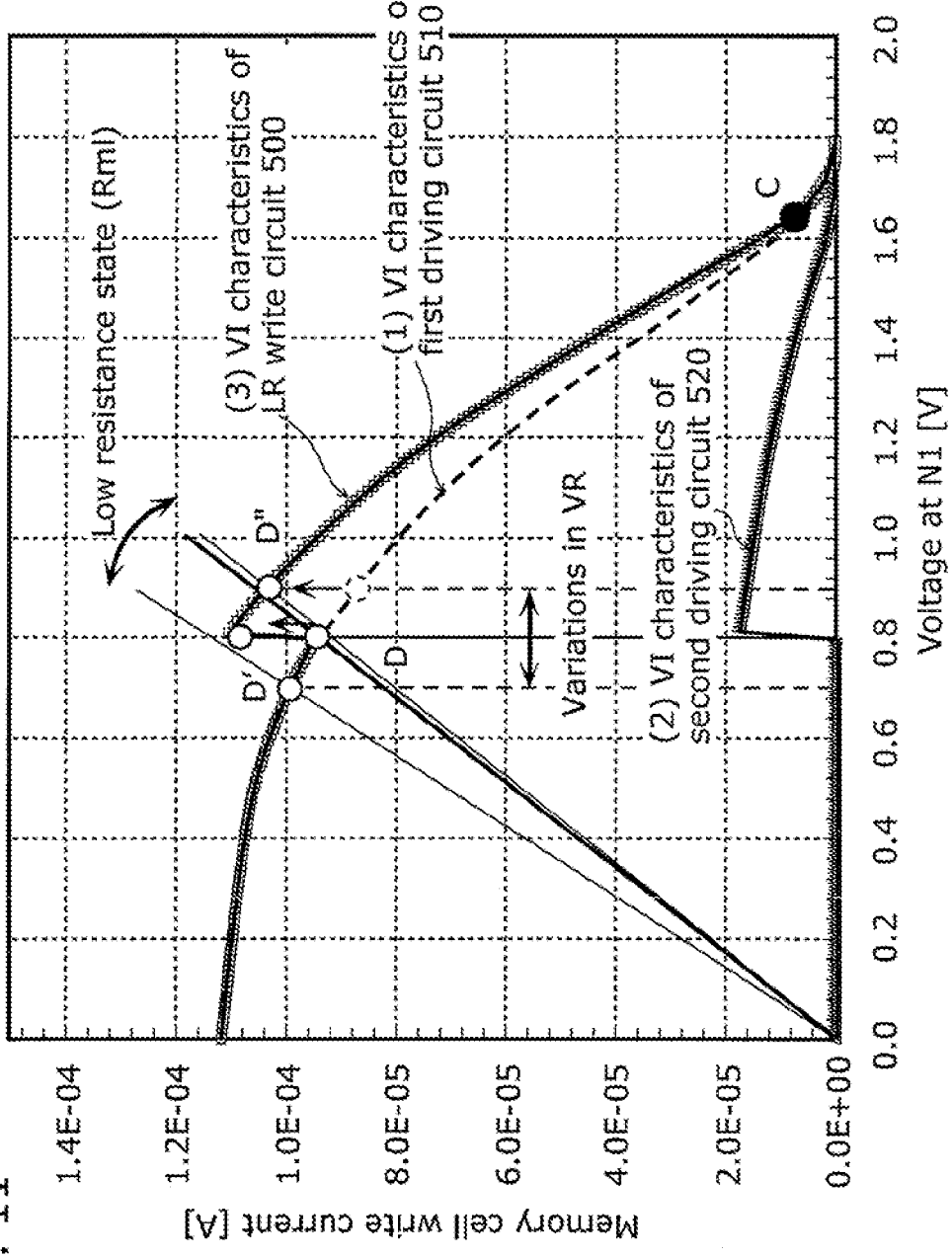
FIG. 11 illustrates an operating point analysis diagram according to Embodiment 1 in the present invention.

FIG. 11 illustrates an operating point analysis diagram for describing operating points of the LR write circuit 500 and the variable resistance element R00 in the variable resistance nonvolatile storage device 200 according to Embodiment 1 in the present invention, when the resistance state of the variable resistance element R00 is changed from the high resistance state to the low resistance state. The horizontal axis represents the voltage at the node N1 between the selection transistor N00 and the variable resistance element R00 in the memory cell M00, and the vertical axis represents the memory cell write current that flows from the output terminal WD of the write circuit 206.

The characteristics (1) of the first driving circuit 510 are represented by an output load curve when the power source for LR writing 220 supplies the VL potential of 1.8 V to the first driving circuit 510. When a voltage at the node N1 is 1.8 V, the current supplied from the first driving circuit 510 is 0 A (0 ampere). When a voltage at the node N1 is 0 V, the first driving circuit 510 supplies the current of approximately 112 μA. Here, since the driving current (that is, a first current) of the first driving circuit 510 is limited to be smaller than that of the selection transistor N00, the first driving circuit 510 has characteristics different from those of the conventional driving circuit in FIG. 6. In other words, in the conventional driving circuit in FIG. 6, since the selection transistor 111 in FIG. 5 determines the voltage and the current to be applied to the variable resistance element 110, the driving current almost linearly increases as the voltage at the node N1 decreases. The slope of the characteristics was large, and the amplitude of the memory cell write current was approximately 100 μA between the operating points B' and B", which was larger than the variations in the low resistance change voltage VR. In contrast, since the variable resistance nonvolatile storage device 200 in the present invention limits the driving current supplied from the LR write circuit 500 rather than the driving current supplied from the selection transistor N00 and others (that is, the impedance of the selection transistor N00 in the ON state is lower than the output impedance of the LR write circuit 500), the LR write circuit 500 determines the voltage and the current to be applied to the variable resistance element R00 and others.

More specifically, as illustrated in FIG. 11, the load characteristics (1) of the first driving circuit 510 indicate that the driving current increases as the voltage at the node N1 decreases, although the change in the slope representing the current becomes smaller around the low resistance change voltage VR than the change in the voltage. Here, the load characteristics (1) are determined according to output characteristics of the first driving circuit 510 based on a relationship between the impedance of the selection transistor N00 and the output impedance of the LR write circuit 500. In other words, the first driving circuit 510 has the output characteristics in which the output current decreases according to increase in the output voltage.

The characteristics (2) are represented by an output curve of the second driving circuit 520 when the power source for LR writing 220 supplies the VL potential of 1.8 V to the second driving circuit 520. The second driving circuit 520 has output characteristics of outputting the second current only when the voltage at the output terminal of the first driving circuit 510 is higher than the predetermined first reference voltage VREF1. Here, the first reference voltage VREF1 generated by the first reference voltage generation circuit 230 is set so that the potential at the node N1 has an inflection point around the low resistance change voltage VR=0.8 V. In other words, when a voltage at the node N1 is 1.8 V, the current supplied from the second driving circuit 520 (that is, a second current) is 0 A. When a voltage at the node N1 is smaller than 1.8 V, the second current gradually increases. When a voltage at the node N1 is 1.8 V, the second driving circuit 520 supplies the current (the second current) of approximately 18 μA. When the voltage is smaller than 1.8 V, the current supplied from the second driving circuit 520 is 0 A. As illustrated in FIG. 11, when current is supplied, the current supplied from the second driving circuit 520 (the second current) is smaller than the current supplied from the first driving circuit 510 (the first current) and is larger than 0 A.

Here, since an output current from the LR write circuit 500 is a sum current of output currents from the first driving circuit 510 and the second driving circuit 520 (the first and the second currents), output load characteristics of the LR write circuit 500 are represented by a curve (3).

As described in Basic data according to the present invention, the resistance value of the variable resistance element R00 in the low resistance state is determined according to the current value of the current flowing through the variable resistance element R00 when the voltage at both ends of the variable resistance element R00 reaches the low resistance change voltage VR. Thus, although the high resistance state of the variable resistance element R00 is represented by a point C in the operating point analysis diagram of FIG. 11, the operating point C when the resistance state is changed from the high resistance state to the low resistance state moves to a point D where the current flowing through the variable resistance element R00 matches the current flowing through the LR write circuit 500. The slope of the load line (RmL) of the variable resistance element R00 at the point D is the resistance value in the low resistance state. Here, even when the low resistance change voltage VR varies in a range, for example, 0.8V±0.1V which was uncovered by the inventors, the resistance value of the variable resistance element R00 only ranges between the operating point D' and the operating point D". The calculated resistance value of the variable resistance element R00 in the simulation approximately ranges between 7.1 kΩ and 8.7 kΩ. The variations may be limited to approximately 1.23 times as large as the lowest resistance value.

Although the first reference voltage VREF1 of the first reference voltage generation circuit 230 is set so that the potential at the node N1 has an inflection point around the low resistance change voltage VR=0.8 V according to Embodiment 1 in the present invention, the first reference voltage VREF1 may be any voltage as long as it is set within a voltage range for being supplied by the LR write circuit 500 so that the voltage to be applied to a variable resistance element falls within a voltage range, as the low resistance change voltage VR. For example, assuming that VRa denotes an average of the low resistance change voltages VR, VR1 denotes the smallest value of the average, VD1 denotes a smallest value of a voltage drop from the LR write circuit 500 to a variable resistance element, and VD2 denotes the largest value of the voltage drop, the first reference voltage VREF1 of the first reference voltage generation circuit 230 has only to fall within a range represented by the following relational expression.

$$(VD1+VR1) \le VREF1(VD2+VRa)$$

More specifically, the variable resistance element R00 varies in a range including VRa=0.8 V and VR1=0.7 V as described above. Assuming that the smallest value of the voltage drop from the LR write circuit 500 to the variable resistance element is VD1=0.05 V and the largest value is VD2=0.3 V, the first reference voltage VREF1 of the first reference voltage generation circuit 230 has only to range between 0.75 V and 1.10 V.

Furthermore, the second driving circuit 520 desirably supplies the driving current smaller than the driving current supplied from the first driving circuit 510, and larger than 0 A (or not smaller than 0 A).

As described above, since the load characteristics of the LR write circuit 500 are set so that variations in the current that flows through a memory cell is smaller than those of the conventional low resistance change voltage VR in the nonvolatile storage device 200 according to Embodiment 1, variations in the variable resistance element in the low resistance state become smaller than those of the conventional variable resistance element.

Embodiment 2

Next, a nonvolatile storage device according to Embodiment 2 will be described.

Figure 12:
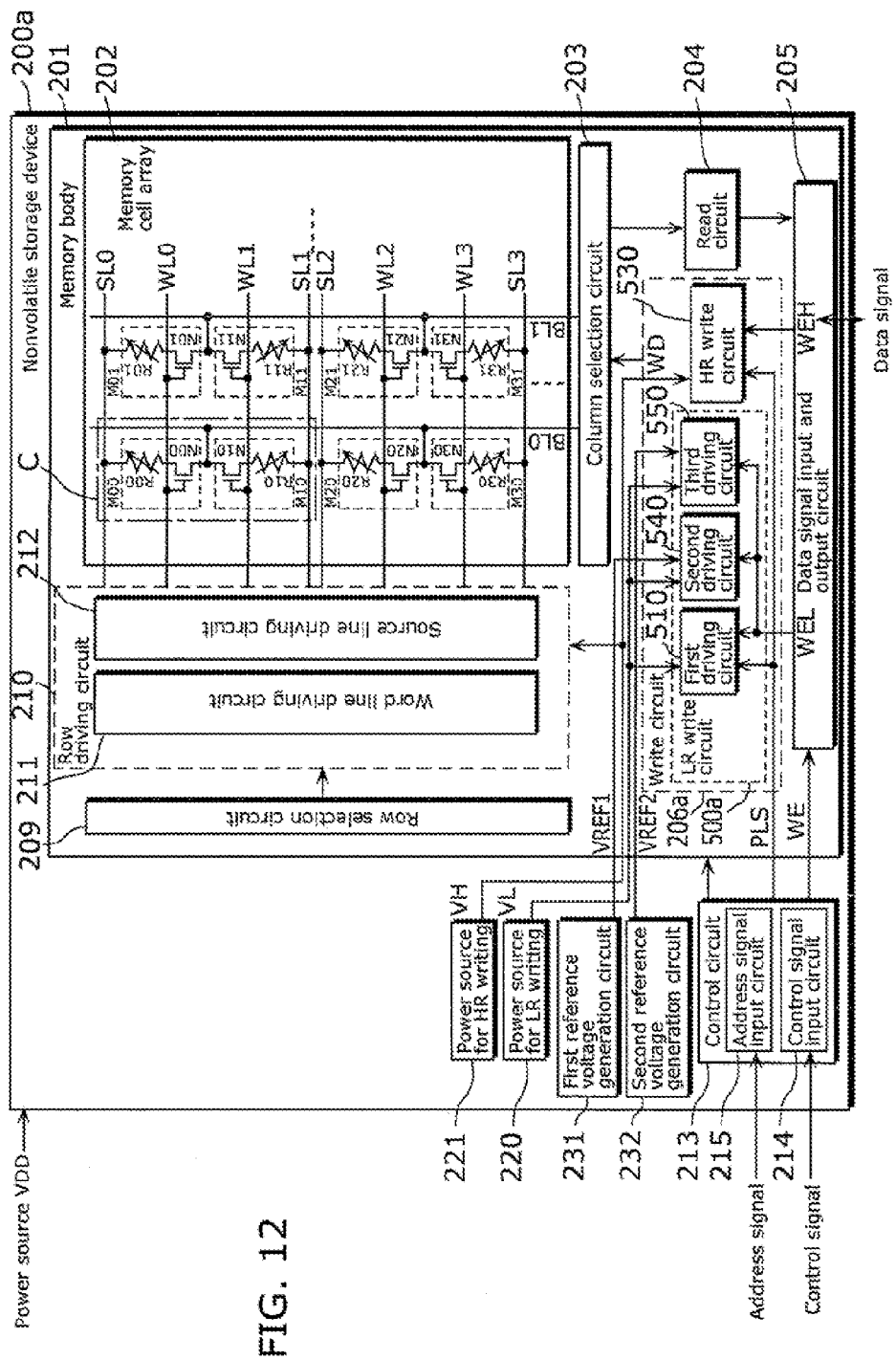
FIG. 12 illustrates a configuration of a nonvolatile storage device according to Embodiment 2 in the present invention.

FIG. 12 is a block diagram illustrating a configuration of a nonvolatile storage device 200a according to Embodiment 2 in the present invention. The nonvolatile storage device 200a is different from the nonvolatile storage device 200 according to Embodiment 1 by including two reference voltage generation circuits (first reference voltage generation circuit 231 and second reference voltage generation circuit 232) and a write circuit 206a including an LR write circuit 500a including three driving circuits (first driving circuit 510, second driving circuit 540, third driving circuit 550). The differences will be described hereinafter.

Figure 13:
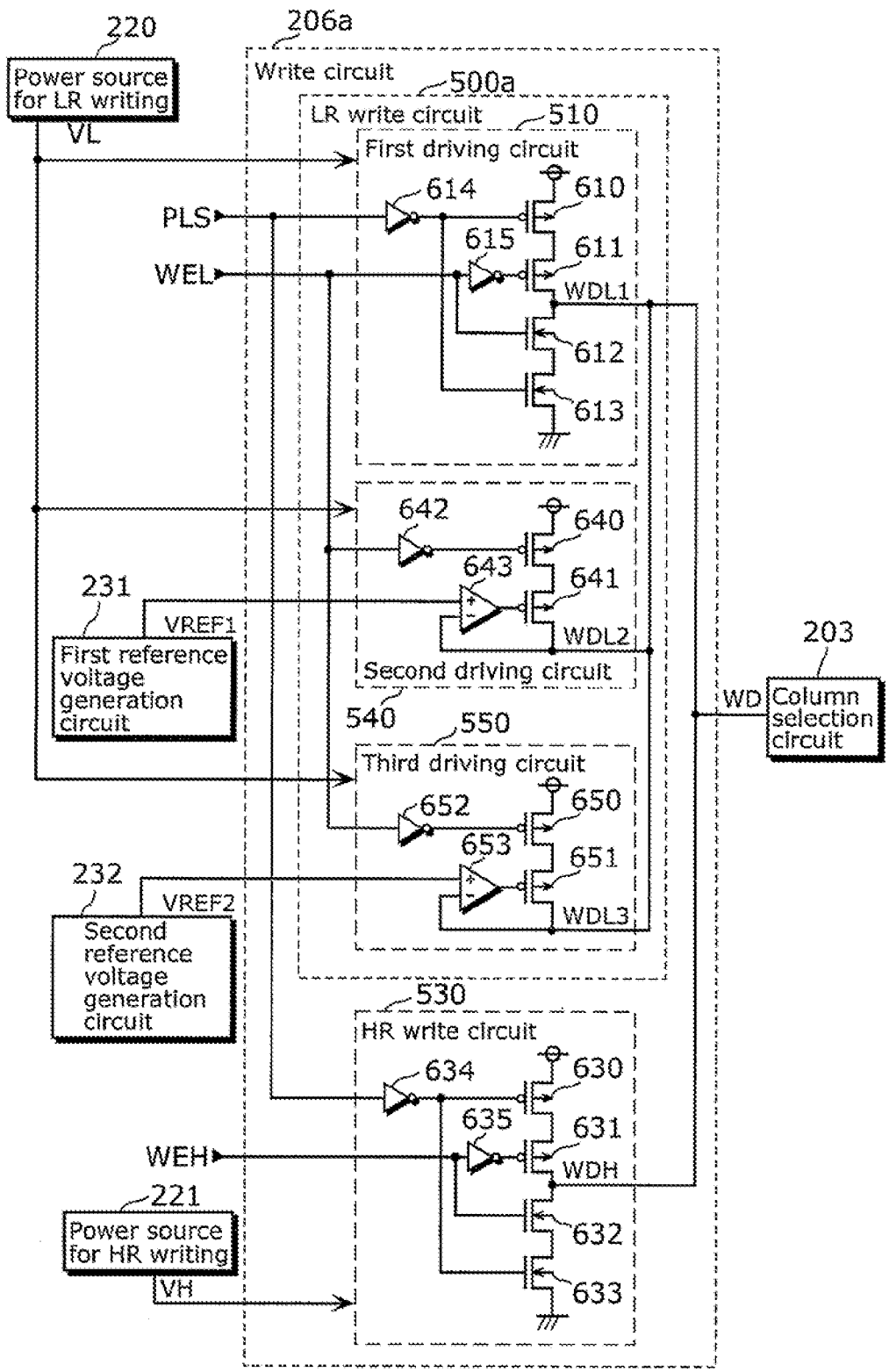
FIG. 13 illustrates a configuration of a write circuit according to Embodiment 2 in the present invention.

FIG. 13 illustrates a specific example of a circuit configuration of the write circuit 206a according to Embodiment 2 in the present invention, and a circuit diagram indicating a power source for LR writing 220, a power source for HR writing 221, the first reference voltage generation circuit 231, the second reference voltage generation circuit 232, and the connection relationship between these elements. As illustrated in FIG. 13, the write circuit 206a according to Embodiment 2 includes: the LR write circuit 500a that applies a voltage and a current to a memory cell for changing a state of each of variable resistance elements R00, R01, . . . from a high resistance state to a low resistance state; and an HR write circuit 530 that applies a voltage and a current to a memory cell for changing a state of each of the variable resistance elements R00, R01, . . . from the low resistance state to the high resistance state.

The LR write circuit 500a is an example of a low-resistance-state write circuit that applies a voltage to a memory cell selected by a row selection circuit 209 and a column selection circuit 203 so as to change a resistance state of a corresponding one of the variable resistance elements R00 and others included in the selected memory cell from the high resistance state to the low resistance state by applying a positive voltage to a first electrode (lower electrode 400a) with respect to a second electrode (upper electrode 400c) of the variable resistance element. The LR write circuit 500a includes the first driving circuit 510, the second driving circuit 540, and the third driving circuit 550. Since details of the first driving circuit 510 and the HR write circuit 530 are the same as those described according to Embodiment 1 in the present invention, the description will be omitted in Embodiment 2.

The second driving circuit 540 includes a PMOS 640, a PMOS 641 serving as the first driving element, an inverter 642, and a voltage comparator circuit 643 serving as the first comparator circuit. In the case where the LR write circuit 500a applies a voltage to a memory cell for changing the resistance state to the low resistance state, when a voltage at an output terminal WDL1 of the first driving circuit 510 is higher than a predetermined first reference voltage VREF1, the second driving circuit 540 supplies a second current. When the voltage at the output terminal WDL1 of the first driving circuit 510 is lower than the predetermined first reference voltage VREF1, the second driving circuit 540 is in the high impedance state. The PMOS 640 and the PMOS 641 have main terminals (drain terminals or source terminals) connected in series with each other in this order, and form a single current path. Furthermore, one of the two main terminals of the PMOS 640 that is not connected to any terminal of the PMOS 641 (source terminal) is connected to a power source (for example, the power source for LR writing 220). Furthermore, one of the two main terminals of the PMOS 641 that is not connected to any terminal of the PMOS 640 (drain terminal) is connected to one of the two input terminals of the voltage comparator circuit 643 (for example, negative terminal), and is also connected to the output terminal WDL2 of the second driving circuit 540. Here, the output terminal WDL1 of the first driving circuit 510 is connected to the output terminal WDL2 of the second driving circuit 540.

The output terminal of the voltage comparator circuit 643 is connected to a gate terminal of the PMOS 641. Furthermore, the other one of the input terminals of the voltage comparator circuit 643 (for example, positive terminal) is connected to the output terminal of the first reference voltage generation circuit 231, and the first reference voltage VREF1 is applied to the input terminal. The voltage comparator circuit 643 compares the first reference voltage VREF1 input to the positive terminal, with a voltage obtained by feeding back, into the negative terminal, the voltage at the output terminal WDL1 of the driving circuit 510 connected to the output terminal WDL2 of the second driving circuit 540. When the first reference voltage VREF1 is higher than the feedback voltage, the output from the voltage comparator circuit 643 is equal to the VL potential supplied from the power source for LR writing 220. Thus, the PMOS 641 is placed in an OFF state, and the output terminal WDL2 of the second driving circuit 540 is placed in the Hi-Z state. Furthermore, the voltage comparator circuit 643 compares the first reference voltage VREF1 input to the positive terminal, with a voltage obtained by feeding back, into the negative terminal, the voltage at the output terminal WDL1 of the driving circuit 510 connected to the output terminal WDL2 of the second driving circuit 540. When the first reference voltage VREF1 is lower than the feedback voltage, the output from the voltage comparator circuit 643 is equal to the ground potential (VSS), and thus, the PMOS 641 is placed in an ON state. When the PMOS 640 is in the ON state, the potential of the source terminal of the PMOS 640, that is, the VL potential is supplied from the power source for LR writing 220 to the output terminal WDL2 of the second driving circuit 540. Thereby, the second current is supplied. When the output terminal WDL1 has the same potential as the first reference voltage VREF1, the voltage comparator circuit 643 may be set to output one of the VL potential and the ground potential (or output may not be defined).

Furthermore, the data signal input and output circuit 205 outputs the LR write enable signal WEL to the input terminal of the inverter 642, and the inverter 642 outputs the LR write enable signal WEL to the gate of the PMOS 640 as an inversion signal.

When the LR write enable signal WEL is in the H state, the second driving circuit 540 provides the Hi-Z state from the output terminal WDL2 as described above, or the power source for LR writing 220 supplies the VL potential to the output terminal WDL2 of the second driving circuit 540, according to a relationship between voltages of the two input terminals of the voltage comparator circuit 643. Furthermore, when the LR write enable signal WEL is in the L state, the second driving circuit 540 provides the Hi-Z state from the output terminal WDL2.

The third driving circuit 550 includes a PMOS 650, a PMOS 651 serving as the second driving element, an inverter 652, and a voltage comparator circuit 653 serving as the second comparator circuit. In the case where the LR write circuit 500a applies a voltage to a memory cell for changing the resistance state to the low resistance state, when a voltage at the output terminal WDL1 of the first driving circuit 510 is higher than a predetermined second reference voltage VREF2, the third driving circuit 550 supplies a third current. When a voltage at an output terminal WDL3 of the third driving circuit 550 is lower than the second reference voltage VREF2, the third driving circuit 550 is in the high impedance state. The PMOS 650 and the PMOS 651 have main terminals (drain terminals or source terminals) connected in series with each other in this order, and form a single current path. Furthermore, one of the two main terminals of the PMOS 650 that is not connected to any terminal of the PMOS 651 (source terminal) is connected to a power source (for example, the power source for LR writing 220). Furthermore, one of the two main terminals of the PMOS 651 that is not connected to any terminal of the PMOS 650 (drain terminal) is connected to one of the two input terminals of the voltage comparator circuit 653 (for example, negative terminal), and is also connected to the output terminal WDL3 of the third driving circuit 550. Here, the output terminal WDL1 of the first driving circuit 510 is connected to the output terminal WDL3 of the third driving circuit 550.

The output terminal of the voltage comparator circuit 653 is connected to a gate terminal of the PMOS 651. Furthermore, the other one of the input terminals of the voltage comparator circuit 653 (for example, positive terminal) is connected to the output terminal of the second reference voltage generation circuit 232, and the second reference voltage VREF2 is applied to the input terminal. The voltage comparator circuit 653 compares the second reference voltage VREF2 input to the positive terminal, with a voltage obtained by feeding back, into the negative terminal, the voltage at the output terminal WDL1 of the driving circuit 510 connected to the output terminal WDL3 of the third driving circuit 550. When the second reference voltage VREF2 is higher than the feedback voltage, the output from the voltage comparator circuit 653 is equal to the VL potential supplied from the power source for LR writing 220. Thus, the PMOS 651 is placed in an OFF state, and the output terminal WDL3 of the third driving circuit 550 is placed in the Hi-Z state. Furthermore, the voltage comparator circuit 653 compares the second reference voltage VREF2 input to the positive terminal, with a voltage obtained by feeding back, into the negative terminal, the voltage at the output terminal WDL1 of the driving circuit 510 connected to the output terminal WDL3 of the third driving circuit 550. When the second reference voltage VREF2 is lower than the feedback voltage, the output from the voltage comparator circuit 653 is equal to the ground potential (VSS), and thus, the PMOS 651 is placed in an ON state. When the PMOS 650 is in the ON state, the potential of the source terminal of the PMOS 650, that is, the VL potential is supplied from the power source for LR writing 220 to the output terminal WDL3 of the third driving circuit 550. Thereby, the third current is supplied. When the output terminal WDL1 has the same potential as the second reference voltage VREF2, the voltage comparator circuit 653 may be set to output one of the VL potential and the ground potential (or output may not be defined).

Furthermore, the data signal input and output circuit 205 outputs the LR write enable signal WEL to the input terminal of the inverter 652, and the inverter 652 outputs the LR write enable signal WEL to the gate of the PMOS 650 as an inversion signal.

When the LR write enable signal WEL is in the H state, the third driving circuit 550 provides the Hi-Z state from the output terminal WDL3 as described above, or the power source for LR writing 220 supplies the VL potential to the output terminal WDL3 of the third driving circuit 550, according to a relationship between voltages of the two input terminals of the voltage comparator circuit 653. Furthermore, when the LR write enable signal WEL is in the L state, the third driving circuit 550 provides the Hi-Z state from the output terminal WDL3.

The output terminal WDL1 of the first driving circuit 510, the output terminal WDL2 of the second driving circuit 540, the output terminal WDL3 of the third driving circuit 550, and the output terminal WDH of the HR write circuit 530 are connected to the output terminal WD of the write circuit 206*a*, and a signal of the output terminal WD of the write circuit 206*a* drives a bit line selected by the column selection circuit 203.

Figure 14:
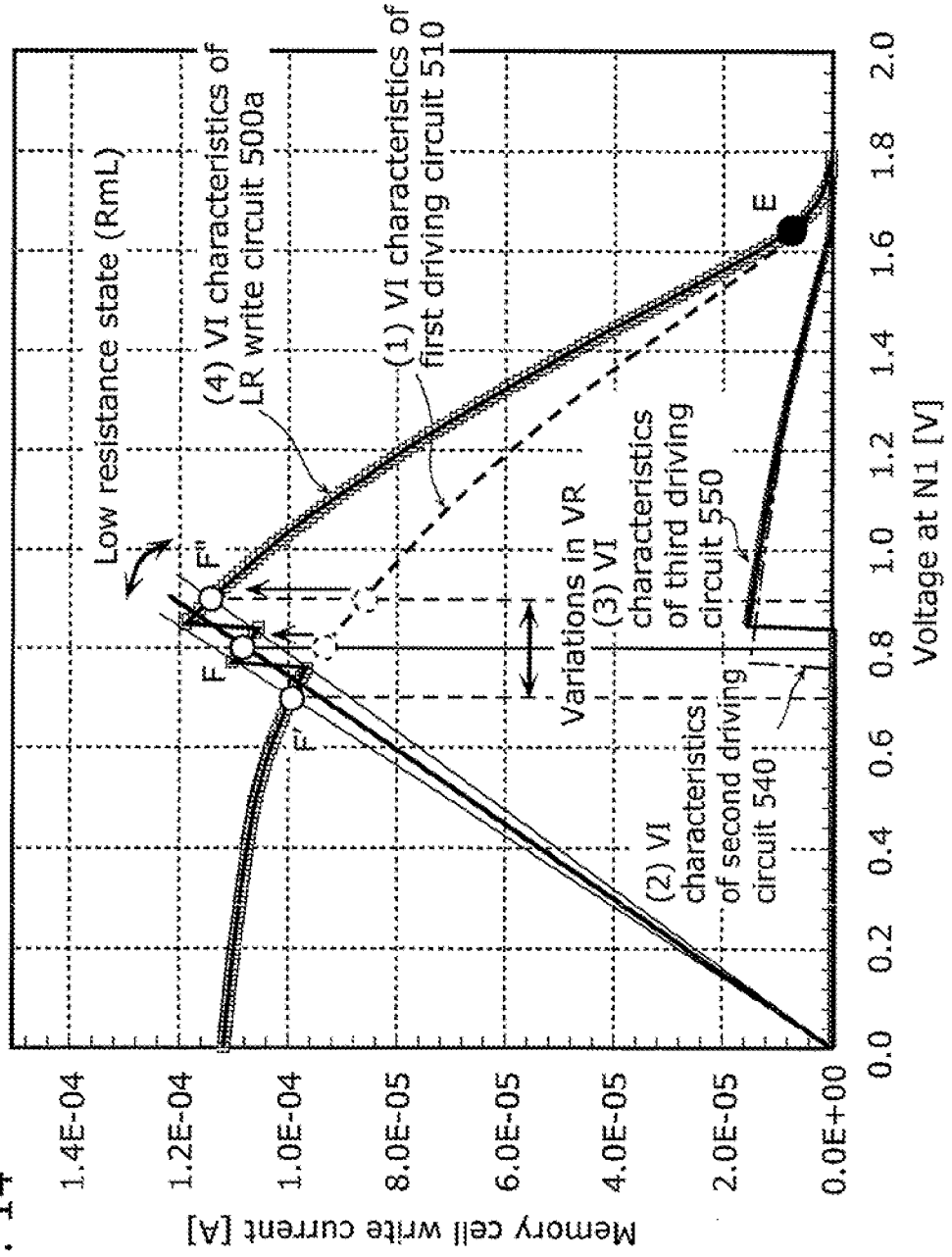
FIG. 14 illustrates an operating point analysis diagram according to Embodiment 2 in the present invention.

FIG. 14 illustrates an operating point analysis diagram for describing operating points of the variable resistance element R00 and the LR write circuit 500*a* when the resistance state of the variable resistance element R00 in the variable resistance nonvolatile storage device according to Embodiment 2 in the present invention is changed from the high resistance state to the low resistance state. The horizontal axis represents the voltage at the node N1 between the selection transistor N00 and the variable resistance element R00 in the memory cell M00, and the vertical axis represents the memory cell write current that flows from the output terminal WD of the write circuit 206*a*.

The characteristics (1) of the first driving circuit 510 are represented by an output load curve when the power source for LR writing 220 supplies the VL potential of 1.8 V to the first driving circuit 510. When a voltage at the node N1 is 1.8 V, the current supplied from the first driving circuit 510 is 0 A. When a voltage at the node N1 is 0 V, the first driving circuit 510 supplies the current of approximately 112 μA. In other words, the first driving circuit 510 has the output characteristics in which the output current decreases according to increase in the output voltage. Here, since the driving current (that is, a first current) of the first driving circuit 510 is limited, the first driving circuit 510 has characteristics different from those of the conventional driving circuit in FIG. 6. In other words, in the conventional driving circuit in FIG. 6, the driving current almost linearly increases as the voltage at the node N1 decreases. The slope of the characteristics was large, and the amplitude of the memory cell write current was approximately 100 μA between the operating points B' and B", which was larger than the variations in the low resistance change voltage VR. In contrast, the load characteristics (1) of the first driving circuit 510 according to the present invention indicate that the driving current increases as the voltage at the node N1 decreases, although the change in the slope representing the current becomes smaller around the low resistance change voltage VR than the change in the voltage.

The characteristics (2) of the second driving circuit 540 are represented by an output load curve, and the characteristics (3) of the third driving circuit 550 are also represented by an output load curve, when the power source for LR writing 220 supplies the VL potential of 1.8 V to the second driving circuit 540 and the third driving circuit 550, respectively. The second driving circuit 540 has output characteristics of outputting the second current only when the voltage at the output terminal of the first driving circuit 510 is higher than the predetermined first reference voltage VREF1, and the third driving circuit 550 has output characteristics of outputting the third current only when the voltage at the output terminal of the first driving circuit 510 is higher than the second reference voltage VREF2. As illustrated in FIG. 14, when current is supplied, each of the current supplied from the second driving circuit 540 (that is, second current) and the current supplied from the third driving circuit 550 (that is, third current) is smaller than the current supplied from the first driving circuit 510 (that is, a first current), and is larger than 0 A.

Here, the first reference voltage VREF1 generated by the first reference voltage generation circuit 231 is set so that the potential at to the node N1 has an inflection point having a value (for example, around 0.77 V) smaller than the low resistance change voltage VR=0.8 V. In other words, when a voltage at the node N1 is 1.8 V, the current supplied from the second driving circuit 540 (a second current) is 0 A. When the voltage at the node N1 exceeds 0.77 V, the second driving circuit 540 supplies the current (the second current) of approximately 15 μA. However, when the voltage at the node N1 is not larger than 0.77 V, the supplied current (the second current) is 0 A. Similarly, the second reference voltage VREF2 generated by the second reference voltage generation circuit 232 is set so that the potential at the node N1 has an inflection point having a value (for example, around 0.85 V) larger than the low resistance change voltage VR=0.8 V. In other words, when a voltage at the node N1 is 1.8 V, the current supplied from the third driving circuit 550 (third current) is 0 A. When the voltage at the node N1 exceeds 0.85 V, the third driving circuit 550 supplies the current (the third current) of approximately 15 µA. However, when the voltage at the node N1 is not larger than 0.85 V, the supplied current (the third current) is 0 A.

Here, when LR writing is performed, since an output current from the LR write circuit 500*a* is a sum current of output currents from the first driving circuit 510, the second driving circuit 540, and the third driving circuit 550 (the first, the second, and the third currents), output load characteristics of the LR write circuit 500*a* are represented by a curve (4).

As described in Basic data according to the present invention, the resistance value of the variable resistance element R00 in the low resistance state is determined according to the current value of the current flowing through the variable resistance element R00 when the voltage at both ends of the variable resistance element R00 reaches the low resistance change voltage VR. Thus, although the high resistance state of the variable resistance element R00 is represented by a point E in the operating point analysis diagram of FIG. 14, the operating point when the resistance state is changed from the high resistance state E to the low resistance state moves to a point F where the current flowing through the variable resistance element R00 matches the current flowing through the LR write circuit 500*a*. The slope of the load line (RmL) of the variable resistance element R00 is the resistance value of the variable resistance element R00 in the low resistance state. Here, even when the low resistance change voltage VR varies in a range, for example, 0.8V±0.1V which was uncovered by the inventors, the resistance value only ranges between the operating point F' and the operating point F". The calculated resistance value of the variable resistance element R00 in the simulation approximately ranges between 7.1 kΩ and 7.9 kΩ. The variations may be limited to approximately 1.12 times as large as the lowest resistance value.

Although the first reference voltage VREF1 generated by the first reference voltage generation circuit 231 and the second reference voltage VREF2 generated by the second reference voltage generation circuit 232 are set so that two inflection points are present around the low resistance change voltage VR=0.8 V according to Embodiment 2 in the present invention, the first reference voltage VREF1 and the second reference voltage VREF2 may be any voltage as long as they are set within a voltage range for being supplied by the LR write circuit 500*a* so that the voltage to be applied to a variable resistance element falls within a voltage range, as the low resistance change voltage VR. For example, assuming that VRa denotes an average of the low resistance change voltages VR, VR1 denotes the smallest value of the average, VR2 denotes the largest value of the average, VD1 denotes a smallest value of a voltage drop from the LR write circuit 500*a* to a variable resistance element, and VD2 denotes the largest value of the voltage drop, the first reference voltage VREF1 generated by the first reference voltage generation circuit 231 has only to fall within a range represented by the following relational expression.

$$(VD1+VR1) \leq VREF1 \leq (VD2+VRa)$$

The second reference voltage VREF2 generated by the second reference voltage generation circuit 232 has only to fall within a range represented by the following relational expression.

$$(VD1+VRa) \leq VREF2 \leq (VD2+VR2)$$

Here, VREF1<VREF2.

More specifically, the variable resistance element R00 varies in a range including VR=0.8 V, VR1=0.7 V, and VR2=0.9 V as described above. Assuming that the smallest value of the voltage drop from the LR write circuit 500*a* to the variable resistance element is VD1=0.05 V and the largest value is VD2=0.3 V, the first reference voltage VREF1 generated by the first reference voltage generation circuit 231 has only to range between 0.75 V and 1.10 V, and the second reference voltage VREF2 generated by the second reference voltage generation circuit 232 has only to range between 0.85 V and 1.20 V.

Furthermore, the second driving circuit 540 and the third driving circuit 550 desirably supply the driving current smaller than the driving current supplied from the first driving circuit 510, and larger than 0 A (or not smaller than 0 A).

As described above, since the load characteristics of the LR write circuit 500*a* are set so that variations in the current that flows through a memory cell is smaller than those of the conventional low resistance change voltage VR in the nonvolatile storage device 200*a* according to Embodiment 2, variations in the variable resistance element in the low resistance state become smaller than those of the conventional variable resistance element.

Embodiment 3

Next, a nonvolatile storage device according to Embodiment 3 will be described. The nonvolatile storage device according to Embodiment 3 basically has the same configuration as that of the nonvolatile storage device according to Embodiment 1 in FIG. 7. However, the detailed configuration of a write circuit according to Embodiment 3 is different from that according to Embodiment 1. The differences will be described hereinafter.

Figure 15:
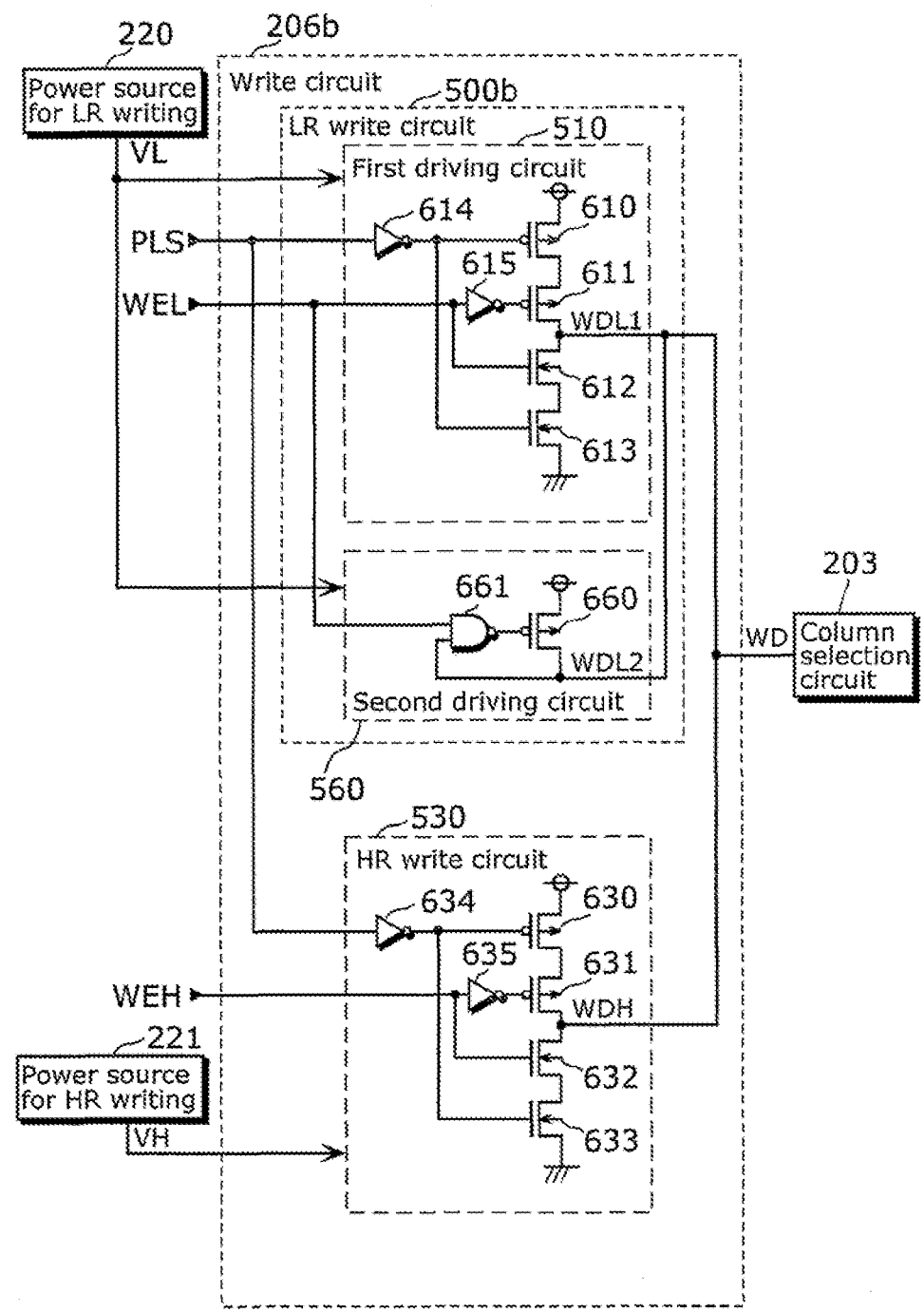
FIG. 15 illustrates a configuration of a write circuit according to Embodiment 3 in the present invention.

FIG. 15 illustrates a specific example of a circuit configuration of a write circuit 206*b* according to Embodiment 3 in the present invention, and a circuit diagram indicating a power source for LR writing 220, a power source for HR writing 221, and the connection relationship between these power sources. As illustrated in FIG. 15, the write circuit 206*b* according to Embodiment 3 includes: an LR write circuit 500*b* that applies a voltage and a current to each of variable resistance elements R00, R01, . . . for changing a state thereof from a high resistance state to a low resistance state; and an HR write circuit 530 that applies a voltage and a current to each of the variable resistance elements R00, R01, . . . for changing a state thereof from the low resistance state to the high resistance state.

The LR write circuit 500*b* includes a first driving circuit 510 and a second driving circuit 560. The LR write circuit 500*b* is an example of a low-resistance-state write circuit that applies a voltage to a memory cell selected by a row selection circuit 209 and a column selection circuit 203 so as to change a resistance state of a corresponding one of the variable resistance elements R00 and others included in the selected memory cell from the high resistance state to the low resistance state by applying a positive voltage to a first electrode (lower electrode 103) with respect to a second electrode (upper electrode 105) of the variable resistance element.

Since details of the first driving circuit 510 and the HR write circuit 530 are the same as those described according to Embodiment 1 in the present invention, the description will be omitted in Embodiment 3.

The second driving circuit 560 includes a PMOS 660 serving as the first driving element and a two-input NAND 661 that is an arithmetic logic element. In the case where the LR write circuit 500b applies a voltage to a memory cell for changing the resistance state to the low resistance state, when a voltage at an output terminal WDL1 of the first driving circuit 510 is higher than a threshold voltage VTH, the second driving circuit 560 supplies the second current. When the voltage at the output terminal WDL1 is lower than the threshold voltage VTH, the second driving circuit 560 is in the high impedance state. One of two main terminals of the PMOS 660 (source terminal) is connected to a power source (for example, the power source for LR writing 220), and the other main terminal (drain terminal) is connected to one of input terminals of the two-input NAND 661 (for example, a second input terminal) and is connected to an output terminal WDL2 of the second driving circuit 560. Here, the output terminal WDL1 of the first driving circuit 510 is connected to the output terminal WDL2 of the second driving circuit 560.

The output terminal of the two-input NAND 661 is connected to a gate terminal of the PMOS 660. Furthermore, the data signal input and output circuit 205 outputs the LR write enable signal WEL to the other input terminal (for example, a first input terminal) of the two-input NAND 661.

When the LR write enable signal WEL is enabled (in the H state), the two-input NAND 661 functions as a comparator circuit (a first comparator circuit) that determines a logical value of a potential of the output terminal WDL1 of the first driving circuit 510, that is, compares the potential of the output terminal WDL1 with the threshold voltage VTH (example of a first reference voltage) that determines a state of the logical value and is held by the two-input NAND 661. As a result, when the LR write enable signal WEL is in the H state according to the state (H or L state) of the second input terminal of the two-input NAND 661, the second driving circuit 560 provides the Hi-Z state from the output terminal WDL2 as described above, or the power source for LR writing 220 supplies the potential of the source terminal of the PMOS 660, that is, the VL potential (that is, the second current) to the output terminal WDL2 of the second driving circuit 560. Furthermore, when the LR write enable signal WEL is in the L state, the second driving circuit 560 provides the Hi-Z state from the output terminal WDL2. When the output terminal WDL1 has the same potential as the threshold voltage VTH, the two-input NAND 661 may be set to provide the H state or the L state (or output may not be defined).

Here, the two-input NAND 661 is a general arithmetic logic element composed of two PMOSs and two NMOSs, and may be a circuit having a function of a multiple-input NAND. The threshold voltage VTH can be adjusted by changing gate lengths and gate widths of the two PMOSs and the two NMOSs.

The output terminal WDL1 of the first driving circuit 510, the output terminal WDL2 of the second driving circuit 560, and the output terminal WDH of the HR write circuit 530 are connected to an output terminal WD of the write circuit 206b, and a signal of the output terminal WD of the write circuit 206b drives a bit line selected by the column selection circuit 203.

Figure 16:
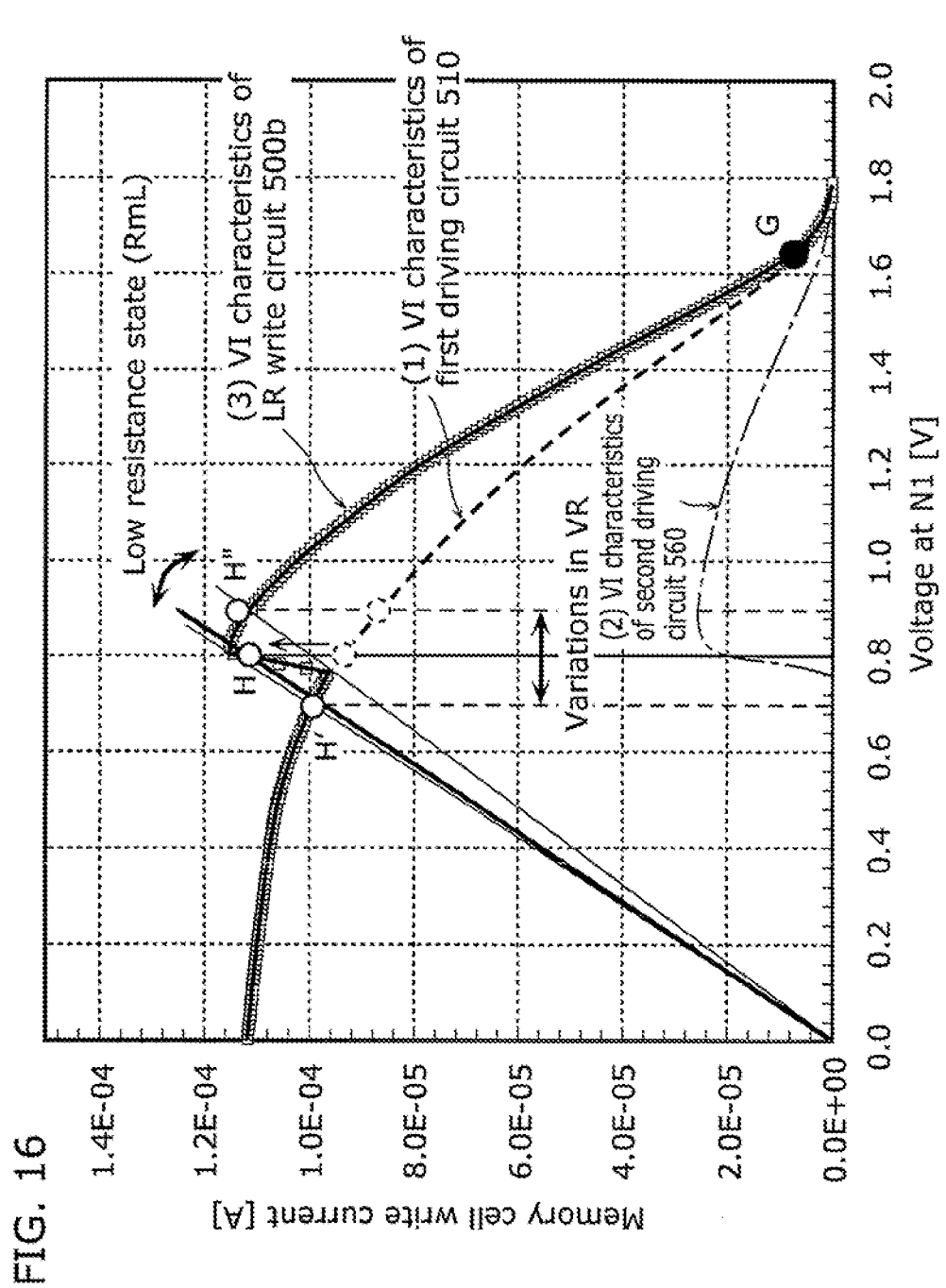
FIG. 16 illustrates an operating point analysis diagram according to Embodiment 3 in the present invention.

FIG. 16 illustrates an operating point analysis diagram for describing operating points of the LR write circuit 500b and the variable resistance element R00 in the variable resistance nonvolatile storage device according to Embodiment 3 in the present invention, when the resistance state of the variable resistance element R00 is changed from the high resistance state to the low resistance state. The horizontal axis represents the voltage at the node N1 between the selection transistor N00 and the variable resistance element R00 in the memory cell M00, and the vertical axis represents the memory cell write current that flows from the output terminal WD of the write circuit 206b.

The characteristics (1) of the first driving circuit 510 are represented by an output load curve when the power source for LR writing 220 supplies the VL potential of 1.8 V to the first driving circuit 510. When a voltage at the node N1 is 1.8 V, the current supplied from the first driving circuit 510 is 0 A. When a voltage at the node N1 is 0 V, the first driving circuit 510 supplies the current of approximately 112 µA. In other words, the first driving circuit 510 has the output characteristics in which the output current decreases according to increase in the output voltage. Here, since the driving current (that is, a first current) of the first driving circuit 510 is limited as described above, the first driving circuit 510 has characteristics different from those of the conventional driving circuit in FIG. 6. In other words, in the conventional driving circuit in FIG. 6, the driving current almost linearly increases as the voltage at the node N1 decreases. The slope of the characteristics was large, and the amplitude of the memory cell write current was approximately 100 µA between the operating points B' and B", which was larger than the variations in the low resistance change voltage VR. In contrast, the load characteristics (1) of the first driving circuit 510 according to the present invention indicate that the driving current increases as the voltage at the node N1 decreases, although the change in the slope representing the current becomes smaller around the low resistance change voltage VR than the change in the voltage.

The characteristics (2) of the second driving circuit 560 are also represented by an output load curve when the power source for LR writing 220 supplies the VL potential of 1.8 V to the second driving circuit 560. The second driving circuit 560 has output characteristics of outputting the second current only when the voltage at the output terminal WDL1 of the second driving circuit 560 is higher than the predetermined threshold voltage VTH. Here, the threshold voltage VTH of the two-input NAND 661 is set so that the potential at the node N1 has an inflection point at the low resistance change voltage VR=0.8 V. In other words, when a voltage at the node N1 is 1.8 V, the current supplied from the second driving circuit 560 (second current) is 0 A. When the voltage at the node N1 exceeds 0.8 V, the second driving circuit 560 supplies the current (the second current) of approximately 28 µA. However, when the voltage at the node N1 is not larger than 0.8 V, the supplied current (the second current) is 0 A. As illustrated in FIG. 16, when the second current is supplied, the current supplied from the second driving circuit 560 (that is, the second current) is smaller than the current supplied from the first driving circuit 510 (that is, the first current), and is larger than 0 A.

Here, since an output current from the LR write circuit 500b is a sum current of output currents from the first driving circuit 510 and the second driving circuit 560, output load characteristics of the LR write circuit 500b are represented by a curve (3).

As described in Basic data according to the present invention, the resistance value of the variable resistance element R00 in the low resistance state is determined according to the current value of the current flowing through the variable resistance element R00 when the voltage at both ends of the variable resistance element R00 reaches the low resistance change voltage VR. Thus, although the high resistance state of the variable resistance element R00 is represented by a point G in the operating point analysis diagram of FIG. 16, the operating point G when the resistance state is changed from the high resistance state to the low resistance state moves to a point H where the current flowing through the variable resistance element R00 matches the current flowing through the LR write circuit 500b. The slope of the load line (RmL) of the variable resistance element R00 is the resistance value of the variable resistance element R00 in the low resistance state. Here, even when the low resistance change voltage VR varies in a range, for example, 0.8 V±0.1 V which was uncovered by the inventors, the resistance value only ranges between the operating point H' and the operating point H" determined by the characteristics (3). The calculated resistance value of the variable resistance element R00 in the simulation approximately ranges between 7.1 kΩ and 8.1 kΩ. The variations may be limited to approximately 1.14 times as large as the lowest resistance value.

Although the threshold voltage VTH of the two-input NAND 661 is set to 0.92 V so that the potential at the node N1 has an inflection point at the low resistance change voltage VR=0.8 V, the threshold voltage VTH may be any voltage as long as it is set within a voltage range for being supplied by the LR write circuit 500b so that the voltage to be applied to a variable resistance element falls within a voltage range, as the low resistance change voltage VR. For example, assuming that VRa denotes an average of the low resistance change voltages VR, VR1 denotes the smallest value of the average, VD1 denotes a smallest value of a voltage drop from the LR write circuit 500b to a variable resistance element, and VD2 denotes the largest value of the voltage drop, the threshold voltage VTH of the two-input NAND 661 has only to fall within a range represented by the following relational expression.

$$(VD1+VR1) \leq VTH \leq (VD2+VRa)$$

More specifically, the variable resistance element R00 varies in a range including VR=0.8V and VR1=0.7V as described above. Assuming that the smallest value of the voltage drop from the LR write circuit 500b to the variable resistance element is VD1=0.05 V and the largest value is VD2=0.3V, the threshold voltage VTH of the two-input NAND 661 has only to range between 0.75 V and 1.10 V.

Furthermore, the second driving circuit 560 desirably supplies the driving current smaller than the driving current supplied from the first driving circuit 510, and larger than 0 A (or not smaller than 0 A).

As described above, since the load characteristics of the LR write circuit 500b are set so that variations in the current that flows through a memory cell is smaller than those of the conventional low resistance change voltage VR in the nonvolatile storage device according to Embodiment 3, variations in the variable resistance element in the low resistance state become smaller than those of the conventional variable resistance element.

Although the variable resistance nonvolatile storage device according to the present invention is described based on Embodiments 1 to 3, the present invention is not limited to Embodiments. Many modifications of the exemplary Embodiments conceivable by those skilled in the art, and other embodiments conceivable by arbitrarily combining the structural elements and/or steps of different embodiments are intended to be included within the scope of the present invention, without materially departing from the novel teachings and advantages of the present invention.

For example, the LR write circuit 500 includes the two driving circuits (first driving circuit 510 and second driving circuit 520) according to Embodiment 1, and the LR write circuit 500a includes the three driving circuits (first driving circuit 510, second driving circuit 540, and third driving circuit 550) according to Embodiment 2. However, the present invention is not limited to the number of driving circuits. The combined load characteristics of a whole LR write circuit may be set by the combined use of any number of driving circuits having load characteristics with different inflection points so that variations in a current that flows through a memory cell is smaller than variations in the low resistance change voltage VR. Thereby, variations in a resistance value of a variable resistance element in the low resistance state can be further reduced.

Figure 17:
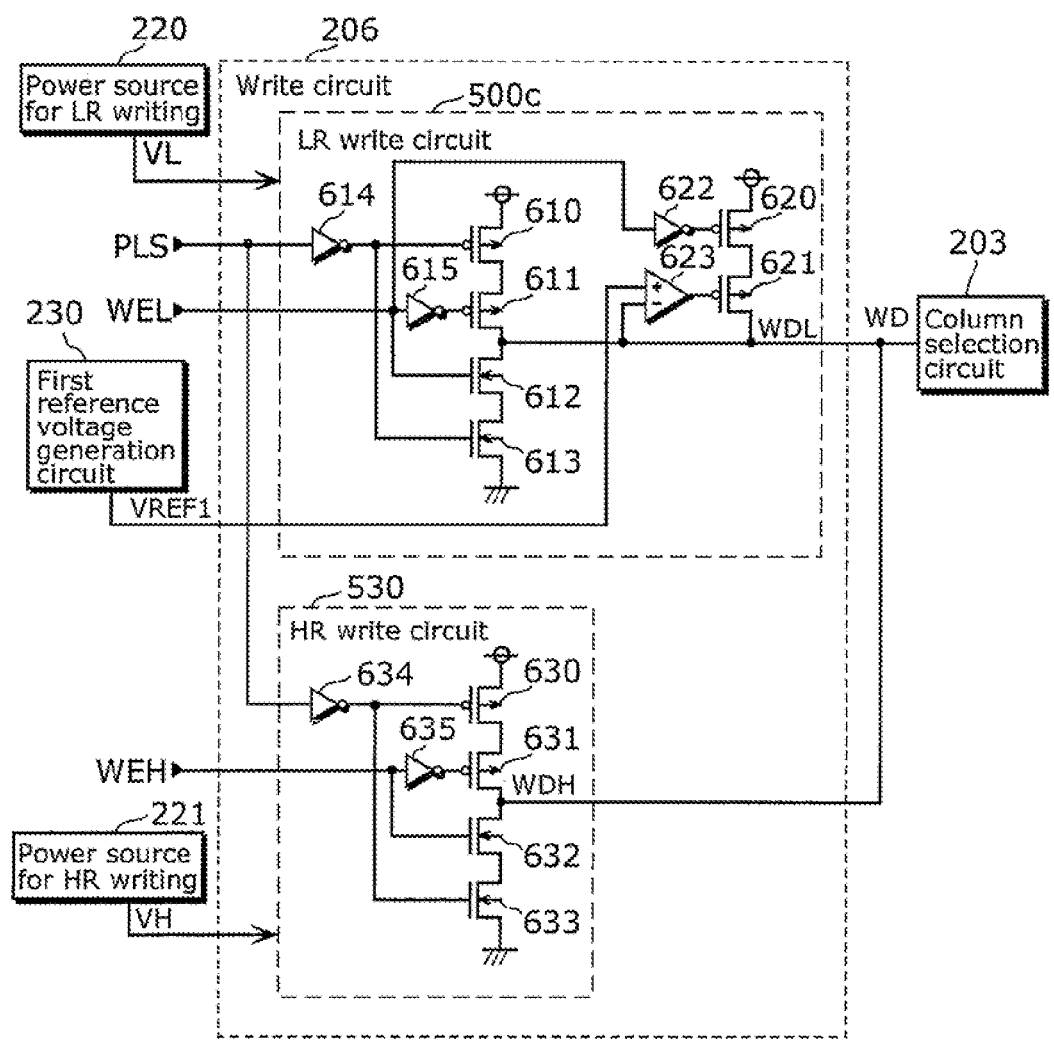
FIG. 17 illustrates a configuration of a write circuit equivalent to the write circuit according to Embodiment 1 in the present invention.

Furthermore, the LR write circuit according to the present invention may be implemented as an LR write circuit (low-resistance-state write circuit) physically using one driving circuit, as the LR write circuit 500c in FIG. 17. The LR write circuit 500c in FIG. 17 is electrically equivalent to a circuit including the first driving circuit 510 and the second driving circuit 520 in FIG. 9. In other words, as long as the LR write circuit according to the present invention is a driver, the LR write circuit is not affected by the physical number of driving circuits included the driver. Here, the driver has load characteristics in which the output current increases according to increase in the output voltage when the voltage to be applied to a variable resistance element whose resistance state is changed to the low resistance state falls within the variations in the low resistance change voltage VR.

Figure 18:
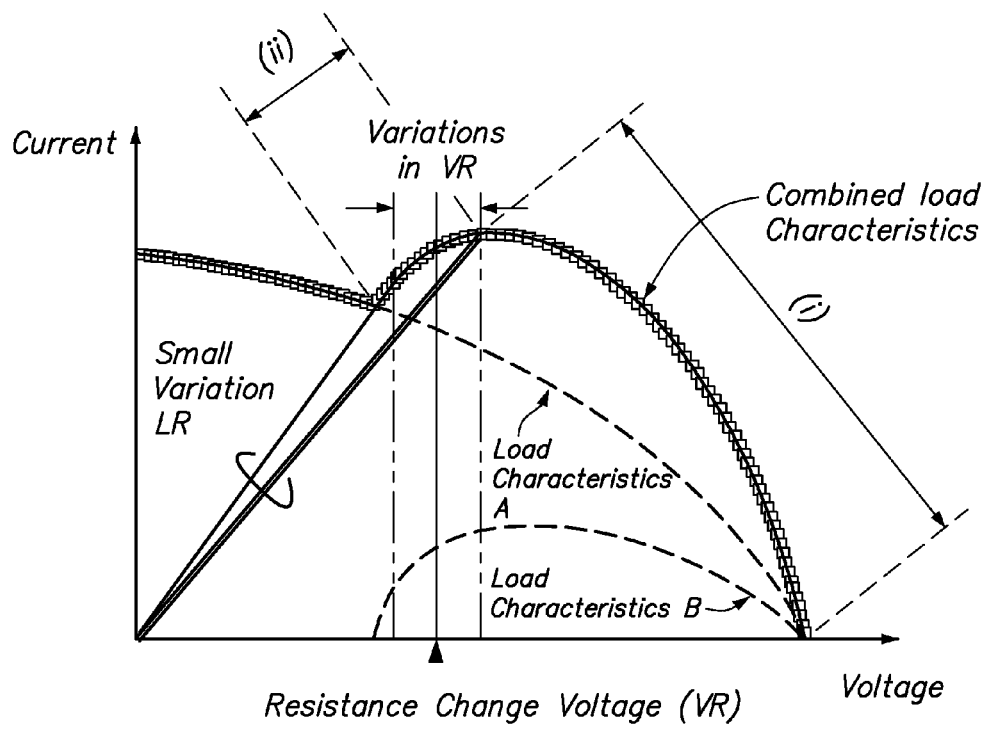
FIG. 18 illustrates combined load characteristics of an LR write circuit according to the present invention.
Figure 19:
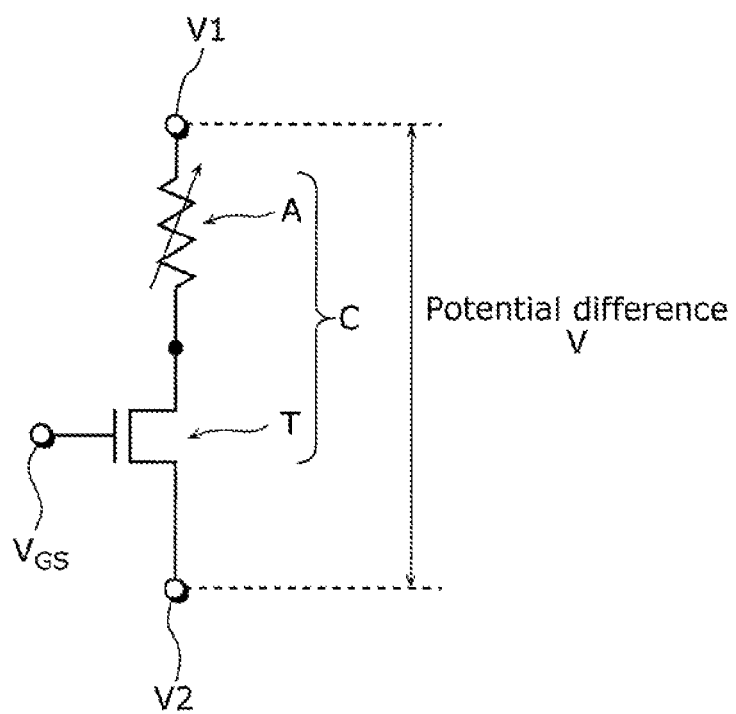
FIG. 19 illustrates a configuration of a memory cell disclosed in PTL 1 of the prior art.
Figure 20:
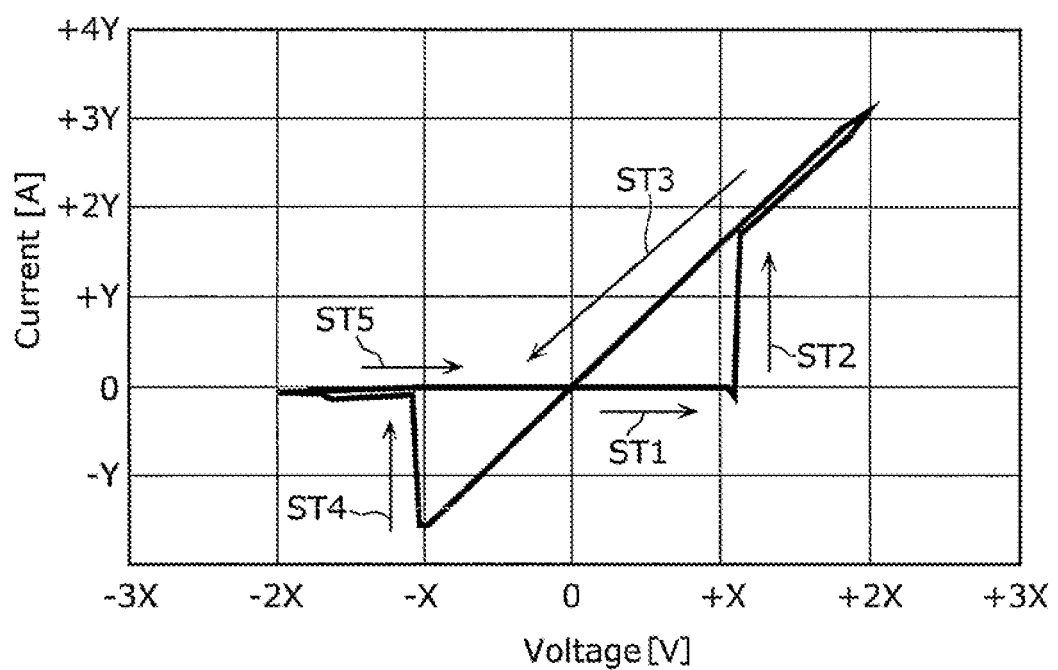
FIG. 20 illustrates voltage/current characteristics of the memory cell disclosed in PTL 1 of the prior art.
Figure 21:
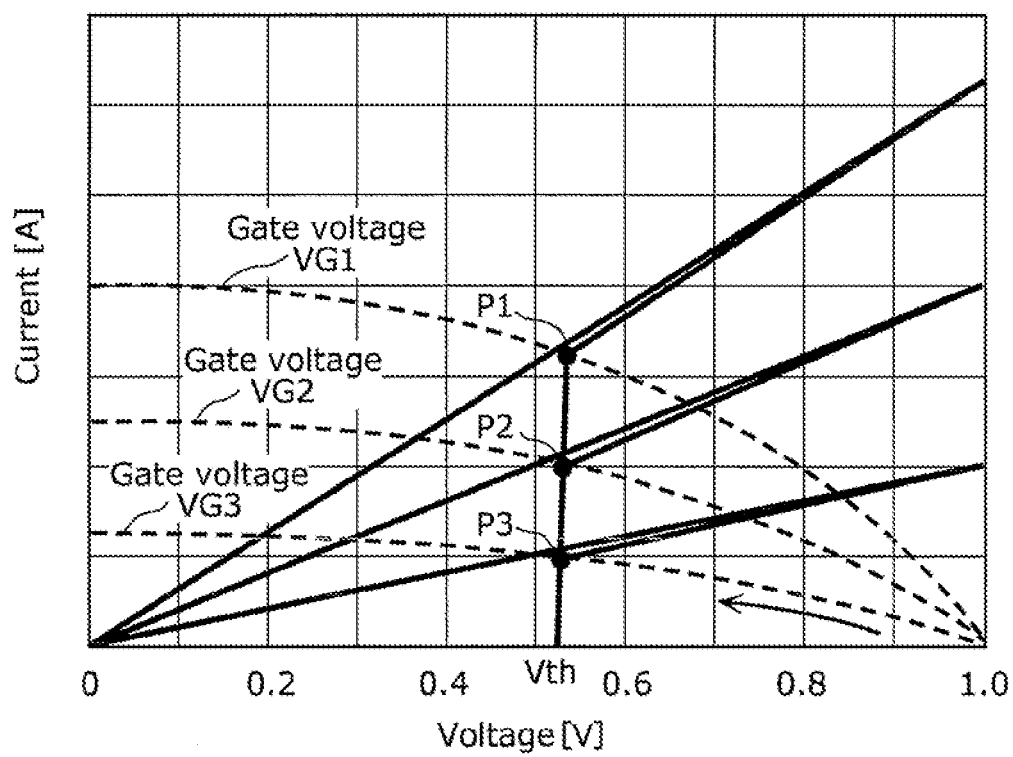
FIG. 21 illustrates an operating point analysis diagram for writing the memory cell disclosed in PTL 1 of the prior art.
Figure 22:
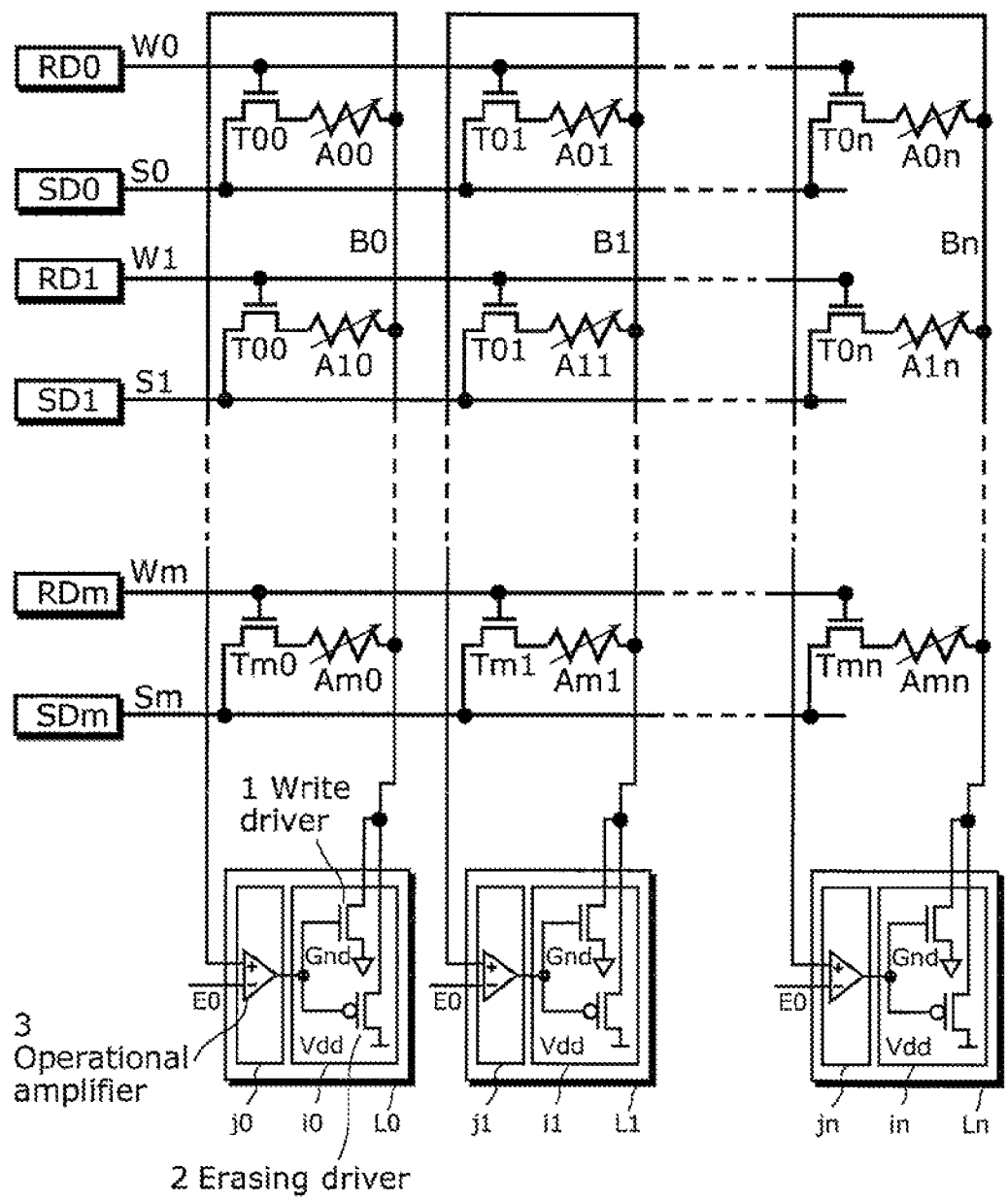
FIG. 22 illustrates a circuit diagram of a storage device disclosed in PTL 2 of the prior art.

In other words, the nonvolatile storage device according to the present invention has only to include an LR write circuit having the combined load characteristics (output VI characteristics) indicated in FIG. 18, and is not limited to a nonvolatile storage device including a particular LR write circuit. Here, the horizontal axis and the vertical axis in FIG. 18 respectively represent an output voltage and an output current from the LR write circuit according to the present invention. In other words, the horizontal axis (output voltage of the LR write circuit) in FIG. 18 is different from the horizontal axis (voltage at the node N1 between a variable resistance element and a selection transistor) in each of the operating point analysis diagrams of FIGS. 11, 14, and 16. However, since the difference is limited to whether or not the voltage at the node N1 includes a source-to-drain voltage of the selection transistor (voltage equivalent to a predetermined voltage), FIG. 18 qualitatively corresponds to the operating point analysis diagrams of FIGS. 11, 14, and 16.

Although the LR write circuit having such characteristics has (1) load characteristics (see "(i)" indicated in FIG. 18) in which the output current (vertical axis) monotonically decreases according to increase in the output voltage (horizontal axis) as a whole (except for a part of an area), it has (2) load characteristics (see (ii) indicated in FIG. 18) in which the output current monotonically increases (or monotonically decreases with a decreasing degree smaller than the whole monotonically decreasing degree) according to increase in the output voltage, in the part of an area, that is, within a voltage range when a voltage to be applied to a variable resistance element whose resistance state is changed to the low resistance state falls within variations in the low resistance change voltage VR. Here, desirably, the degree of a slope representing the monotonous increase substantially matches (or is closer to) the degree of a slope of the load characteristics (that is, the line sloping upward and passing the origin point of the output VI characteristics and the part of the area) of the variable resistance element in the low resistance state. The variable resistance element having such load characteristics satisfies ΔV/ΔI within a range of variations in the low resistance change voltage VR ("Variations in VR" as indicated in FIG. 18), that is, has substantially a fixed resistance value when the variable resistance element is in the low resistance state.

A method of implementing the non-linear combined load characteristics is to combine (1) a current from a driver having the load characteristics A of monotonically decreasing and (2) an output current from a driver having the load characteristics B such that the current is supplied when a voltage to be applied to a variable resistance element falls within variations in the low resistance change voltage VR (or a part of the range) and that the current is not supplied when the voltage is smaller than the variations (alternatively, such that the driver is in the high impedance state).

Furthermore, although the write circuits 206, 206a, and 206b drive the bit lines in the description of Embodiments according to the present invention, they may be placed so as to drive source lines.

Furthermore, although the 1T1R memory cells are mainly described in Embodiments, the resistance change in the memory cells occurs in variable resistance elements included therein. Thus, a storage device which is composed of only a variable resistance element may be targeted for application to a fuse element and others, and may have the same characteristics as the 1T1R memory cells.

Furthermore, although the 1T1R memory cells using the NMOS transistors as the selection elements (switch elements) are described, the selection elements may be PMOS transistors, or may be CMOS transistors using both the NMOS transistors and the PMOS transistors.

Obviously, the same methods and circuits described above are applicable to memory cells in each of which a variable resistance element is connected in series with a rectifier cell (bidirectional diode or the like).

INDUSTRIAL APPLICABILITY

As described above, the variable resistance nonvolatile storage device according to the present invention can stabilize the low resistance state, using the methods and the circuits which allow maximizing of a resistance change window for changing the resistance state of memory cells using variable resistance elements that are included in the variable resistance nonvolatile storage device, between the low resistance state and the high resistance state. Thus, it is useful to support increase in the reading speed and stabilization of the memory cells, and further to improve the yield. Alternatively, the variable resistance nonvolatile storage device may be useful as a state storage circuit instead of a fuse element.

REFERENCE SIGNS LIST

| | |
|---|---|
| 100 | Variable resistance element |
| 101 | Selection transistor |
| 102 | Memory cell |
| 103 | Lower electrode |
| 104 | Variable resistance layer |
| 105 | Upper electrode |
| 110 | Variable resistance element |
| 111 | Selection transistor |
| 112 | Memory cell |
| 200, 200a | (Variable resistance) nonvolatile storage device |
| 201 | Memory body |
| 202 | Memory cell array |
| 203 | Column selection circuit |
| 204 | Read circuit |
| 205 | Data input and output circuit |
| 206, 206a, 206b | Write circuit |
| 209 | Row selection circuit |
| 210 | Row driving circuit |
| 211 | Word line driving circuit |
| 212 | Source line driving circuit |
| 213 | Control circuit |
| 214 | Control signal input circuit |
| 215 | Address signal input circuit |
| 220 | Power source for low resistance (LR) writing |
| 221 | Power source for high resistance (HR) writing |
| 230, 231 | First reference voltage generation circuit |
| 232 | Second reference voltage generation circuit |
| 300 | Memory cell |
| 301 | NMOS transistor |
| 302 | Semiconductor substrate |
| 303a | First N-type diffusion layer region |
| 303b | Second N-type diffusion layer region |
| 304a | Gate insulator film |
| 304b | Gate electrode |
| 305 | First via |
| 306 | First wiring layer |
| 307 | Second via |
| 308 | Second wiring layer |
| 309 | Third via |
| 310 | Third wiring layer |
| 400 | Variable resistance element |
| 400a | Lower electrode |
| 400b | Variable resistance layer |
| 400c | Upper electrode |
| 401 | Lower electrode connection via |
| 402 | Upper electrode connection via |
| 500, 500a, 500b, 500c | LR write circuit |
| 510 | First driving circuit |
| 520, 540, 560 | Second driving circuit |
| 530 | HR write circuit |
| 550 | Third driving circuit |
| 610, 611, 620, 621, 630, 631, 640, 641, 650, 651, 660 | PMOS transistor |
| 612, 613, 632, 633 | NMOS transistor |
| 614, 615, 622, 634, 635, 642, 652 | Inverter |
| 623, 643, 653 | Voltage comparator circuit |
| 661 | Two-input NAND |

The invention claimed is:

1. A variable resistance nonvolatile storage device, comprising:

a memory cell array including memory cells arranged in a matrix, each of said memory cells including a variable resistance element and a first switch element connected in series with said variable resistance element, said variable resistance element including (i) a first electrode, (ii) a second electrode, and (iii) a nonvolatile variable resistance layer disposed between said first electrode and said second electrode, said nonvolatile variable resistance layer having a resistance state that reversibly changes between a high resistance state and a low resistance state according to a polarity of a voltage to be applied between said first electrode and said second electrode;

a selection circuit that selects at least one of said memory cells from said memory cell array;

a high-resistance-state write circuit that applies a voltage to said memory cell selected by said selection circuit so as to change a resistance state of said variable resistance element included in said selected memory cell, from the low resistance state to the high resistance state by applying a positive voltage to said second electrode of said variable resistance element with respect to said first electrode of said variable resistance element; and a low-resistance-state write circuit that applies a voltage to said memory cell selected by said selection circuit so as to change the resistance state of said variable resistance element from the high resistance state to the low resistance state by applying a positive voltage to said first electrode with respect to said second electrode, wherein said low-resistance-state write circuit includes a first driving circuit and a second driving circuit both of which apply the voltage to said memory cell, said first driving circuit having an output terminal connected to an output terminal of said second driving circuit, said first driving circuit supplies a first current when said low-resistance-state write circuit applies the voltage to said memory cell, and said second driving circuit (i) supplies a second current when a voltage at the output terminal of said first driving circuit is higher than a predetermined first reference voltage, and (ii) is in a high impedance state when the voltage at the output terminal of said first driving circuit is lower than the first reference voltage, in the case where said low-resistance-state write circuit applies the voltage to said memory cell.

2. The variable resistance nonvolatile storage device according to claim 1, said second driving circuit includes:

a first comparator circuit that compares the voltage at the output terminal of said first driving circuit, with the first reference voltage; and a first driving element that supplies the second current according to a result of the comparison by said first comparator circuit.

3. The variable resistance nonvolatile storage device according to claim 2, further comprising a first reference voltage generation circuit that generates the first reference voltage, wherein said first comparator circuit compares the voltage at the output terminal of said first driving circuit, with the first reference voltage generated by said first reference voltage generation circuit.

4. The variable resistance nonvolatile storage device according to claim 2, wherein said first comparator circuit is an arithmetic logic element, and the arithmetic logic element performs the comparison using, as the first reference voltage, a threshold voltage for determining a state of an input logical value.

5. The variable resistance nonvolatile storage device according to claim 1, wherein the first reference voltage is set within a voltage range for being supplied by said low-resistance-state write circuit so that the voltage to be applied to said variable resistance element falls within a voltage range, as a low resistance change voltage that is a threshold voltage with which the resistance state of said variable resistance element is changed from the high resistance state to the low resistance state.

6. The variable resistance nonvolatile storage device according to claim 5, wherein VREF1 satisfies (VD1+VR1)≤VREF1≤(VD2+VR), where VREF1 denotes the first reference voltage, VR denotes an average of low resistance change voltages for each resistance change in said variable resistance element, VR1 denotes a smallest value of the average, VD1 denotes a smallest value of a voltage drop from said low-resistance-state write circuit to said variable resistance element, and VD2 denotes a largest value of the voltage drop.

7. The variable resistance nonvolatile storage device according to claim 6, wherein said variable resistance layer includes an oxygen-deficient transition metal oxide layer comprising one of tantalum and hafnium, said first electrode and said second electrode comprise materials having different standard electrode potentials, a standard electrode potential V1 of said first electrode, a standard electrode potential V2 of said second electrode, and a standard electrode potential Vt of one of tantalum and hafnium comprised in said variable resistance layer satisfy Vt<V2 and V1<V2, when the low resistance change voltage varies, the average of the low resistance change voltages is 0.8 V, and the smallest value of the average is 0.7 V, and the first reference voltage ranges between 0.75 V and 1.10 V inclusive.

8. The variable resistance nonvolatile storage device according to claim 1, wherein the second current is smaller than the first current, and larger than 0 A.

9. The variable resistance nonvolatile storage device according to claim 1, further comprising a power source for high resistance writing that supplies a voltage for changing the resistance state of said variable resistance element from the low resistance state to the high resistance state; and a power source for low resistance writing that supplies a voltage for changing the resistance state of said variable resistance element from the high resistance state to the low resistance state, wherein said high-resistance-state write circuit applies, to said memory cell, the voltage supplied from said power source for high resistance writing, and said first driving circuit supplies the first current and said second driving circuit supplies the second current, based on the voltage supplied from said power source for low resistance writing.

10. The variable resistance nonvolatile storage device according to claim 1, wherein said low-resistance-state write circuit further includes a third driving circuit having an output terminal connected to the output terminals of said first driving circuit and said second driving circuit, and said third driving circuit (i) supplies a third current when the voltage at the output terminal of said first driving circuit is higher than a predetermined second reference voltage, and (ii) is in the high impedance state when the voltage at the output terminal of said first driving circuit is lower than the second reference voltage, in the case where said low-resistance-state write circuit applies the voltage to said memory cell.

11. The variable resistance nonvolatile storage device according to claim 10, wherein said second driving circuit includes:

a first comparator circuit that compares the voltage at the output terminal of said first driving circuit, with the first reference voltage; and a first driving element that supplies the second current according to a result of the comparison by said first comparator circuit, and said third driving circuit includes:

a second comparator circuit that compares the voltage at the output terminal of said first driving circuit, with the second reference voltage; and a second driving element that supplies the third current according to a result of the comparison by said second comparator circuit.

12. The variable resistance nonvolatile storage device according to claim 11, further comprising
a first reference voltage generation circuit that generates the first reference voltage, and a second reference voltage generation circuit that generates the second reference voltage,
wherein said first comparator circuit compares the voltage at the output terminal of said first driving circuit, with the first reference voltage generated by said first reference voltage generation circuit, and
said second comparator circuit compares the voltage at the output terminal of said first driving circuit, with the second reference voltage generated by said second reference voltage generation circuit.

13. The variable resistance nonvolatile storage device according to claim 10,
wherein each of the first reference voltage and the second reference voltage is set within a voltage range for being supplied by said low-resistance-state write circuit so that the voltage to be applied to said variable resistance element falls within a voltage range, as a low resistance change voltage that is a threshold voltage with which the resistance state of said variable resistance element is changed from the high resistance state to the low resistance state, and
the first reference voltage is different from the second reference voltage.

14. The variable resistance nonvolatile storage device according to claim 13,
wherein VREF1 satisfies (VD1+VR1)≤VREF1≤(VD2+VR), and
VREF2 satisfies (VD1+VR)≤VREF2≤(VD2+VR2) and VREF1<VREF2,
where VREF1 denotes the first reference voltage, VREF2 denotes the second reference voltage, VR denotes an average of low resistance change voltages for each resistance change in said variable resistance element, VR1 denotes a smallest value of the average, VR2 denotes a largest value of the average, VD1 denotes a smallest value of a voltage drop from said low-resistance-state write circuit to said variable resistance element, and VD2 denotes a largest value of the voltage drop.

15. The variable resistance nonvolatile storage device according to claim 14,
wherein said variable resistance layer includes an oxygen-deficient transition metal oxide layer comprising one of tantalum and hafnium,
said first electrode and said second electrode comprise materials having different standard electrode potentials,
a standard electrode potential V1 of said first electrode, a standard electrode potential V2 of said second electrode, and a standard electrode potential Vt of one of tantalum and hafnium comprised in said variable resistance layer satisfy Vt<V2 and V1<V2,
when the low resistance change voltage varies, the average of the low resistance change voltages is 0.8 V, the smallest value of the average is 0.7 V, and the largest value of the average is 0.9 V,
the first reference voltage ranges between 0.75 V and 1.10 V inclusive, and
the second reference voltage ranges between 0.85 V and 1.20 V inclusive.

16. The variable resistance nonvolatile storage device according to claim 10,
wherein the second current and the third current are smaller than the first current, and larger than 0 A.

17. The variable resistance nonvolatile storage device according to claim 10, further comprising:
a power source for high resistance writing that supplies a voltage for changing the resistance state of said variable resistance element from the low resistance state to the high resistance state; and
a power source for low resistance writing that supplies a voltage for changing the resistance state of said variable resistance element from the high resistance state to the low resistance state,
wherein said high-resistance-state write circuit applies, to said memory cell, the voltage supplied from said power source for high resistance writing, and
said first driving circuit, said second driving circuit, and said third driving circuit supply, based on the voltage supplied from said power source for low resistance writing, the first current, the second current, and the third current, respectively.

18. The variable resistance nonvolatile storage device according to claim 1,
wherein said memory cell array further includes bit lines and source lines,
one of said memory cells is provided for a pair of a corresponding one of the bit lines and a corresponding one of the source lines,
each of end terminals of said memory cell is connected to the corresponding one of the bit lines or the source lines,
said selection circuit includes (i) a column selection circuit that selects at least one of the bit lines, and (ii) a row selection circuit that selects at least one of the source lines, and
each of said low-resistance-state write circuit and said high-resistance-state write circuit drives the bit line selected by said column selection circuit or the source line selected by said row selection circuit.

19. The variable resistance nonvolatile storage device according to claim 18,
wherein each of said first switch elements is one of a MOS transistor and a diode.

20. The variable resistance nonvolatile storage device according to claim 19,
wherein said memory cell array further includes word lines,
each of said first switch elements is the MOS transistor having a gate terminal connected to a corresponding one of the word lines,
said row selection circuit selects at least one of the word lines, and
said variable resistance nonvolatile storage device further comprises a word line driving circuit that drives the word line selected by said row selection circuit.

21. A variable resistance nonvolatile storage device, comprising:
a memory cell array including memory cells arranged in a matrix, each of said memory cells including a variable resistance element and a first switch element connected in series with said variable resistance element, said variable resistance element including (i) a first electrode, (ii) a second electrode, and (iii) a nonvolatile variable resistance layer disposed between said first electrode and said second electrode, said nonvolatile variable resistance layer having a resistance state that reversibly changes between a high resistance state and a low resistance state according to a polarity of a voltage to be applied between said first electrode and said second electrode;

a selection circuit that selects at least one of said memory cells from said memory cell array;

a high-resistance-state write circuit that applies a voltage to said memory cell selected by said selection circuit so as to change a resistance state of said variable resistance element included in said selected memory cell, from the low resistance state to the high resistance state by applying a positive voltage to said second electrode of said variable resistance element with respect to said first electrode of said variable resistance element; and a low-resistance-state write circuit that applies a voltage to said memory cell selected by said selection circuit so as to change the resistance state of said variable resistance element from the high resistance state to the low resistance state by applying a positive voltage to said first electrode with respect to said second electrode, wherein said low-resistance-state write circuit is a circuit having load characteristics including (i) an area in which an output current monotonically decreases according to increase in an output voltage, and (ii) an other area in which the output current monotonically increases according to increase in the output voltage.

\* \* \* \* \*